US012651725B2

(12) United States Patent
Kosaka

(10) Patent No.: US 12,651,725 B2
(45) Date of Patent: Jun. 9, 2026

(54) PLASMA PROCESSING APPARATUS, POWER SUPPLY SYSTEM, CONTROL METHOD, PROGRAM, AND STORAGE MEDIUM

(71) Applicant: Tokyo Electron Limited, Tokyo (JP)

(72) Inventor: Yuto Kosaka, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 180 days.

(21) Appl. No.: 18/605,996

(22) Filed: Mar. 15, 2024

(65) Prior Publication Data

US 2024/0222080 A1 Jul. 4, 2024

Related U.S. Application Data

(63) Continuation of application No. PCT/JP2022/048006, filed on Dec. 26, 2022.

(30) Foreign Application Priority Data

Jan. 7, 2022 (JP) ................................. 2022-001662

(51) Int. Cl.
*H01J 37/32* (2006.01)

(52) U.S. Cl.
CPC .. *H01J 37/32165* (2013.01); *H01J 37/32091* (2013.01); *H01J 37/32183* (2013.01); *H01J 2237/327* (2013.01)

(58) Field of Classification Search
CPC ........... H01J 37/32165; H01J 37/32091; H01J 37/32183; H01J 2237/327; H01J 37/32082; H01J 37/32146; H05H 1/46
See application file for complete search history.

(56) References Cited

U.S. PATENT DOCUMENTS 9,734,992 B2 * 8/2017 Yamada ............ H01J 37/32165
2006/0066247 A1 * 3/2006 Koshiishi .......... H01J 37/32834
315/111.21

(Continued)

FOREIGN PATENT DOCUMENTS

JP      2020-004710 A      1/2020
JP      2020-532859 A      11/2020

(Continued)

OTHER PUBLICATIONS

International Search Report and Written Opinion mailed on Mar. 7, 2023, received for PCT Application PCT/JP2022/048006, filed on Dec. 26, 2022, 09 pages including English Translation.

*Primary Examiner* — Daniel D Chang
(74) *Attorney, Agent, or Firm* — XSENSUS LLP

(57) ABSTRACT

In a plasma processing apparatus, electrical bias energy is provided from a bias power supply to a substrate support. Source radio-frequency power is provided from a radio-frequency power supply to a radio-frequency electrode. The radio-frequency power supply selects, from a plurality of frequency groups, an initial frequency group corresponding to a specified process. The radio-frequency power supply uses, in a first period, a plurality of frequencies included in the initial frequency group as a plurality of source frequencies of the source radio-frequency power for a respective plurality of phase periods in a waveform cycle of the electrical bias energy. The radio-frequency power supply adjusts, in a second period, the plurality of source frequencies of the source radio-frequency power for the respective plurality of phase periods in a waveform cycle of the electrical bias energy.

20 Claims, 14 Drawing Sheets

(56) References Cited

U.S. PATENT DOCUMENTS

2015/0122421 A1*  5/2015  Konno ............. H01J 37/32183
                                      156/345.28
2019/0057845 A1*  2/2019  Nagami ........... H01J 37/32128

FOREIGN PATENT DOCUMENTS

JP        2021-106354 A     7/2021
WO        2022/163530 A1    8/2022
WO        2022/163535 A1    8/2022

* cited by examiner

FIG. 7A

| Process ID | Process condition dataset |
|---|---|
| 1 | $b_{11}, b_{21}, b_{31}, b_{41}, \ldots, b_{Y1}$ |
| 2 | $b_{12}, b_{22}, b_{32}, b_{42}, \ldots, b_{Y2}$ |
| $\cdots$ | $\cdots$ |
| X | $b_{1X}, b_{2X}, b_{3X}, b_{4X}, \ldots, b_{YX}$ |

FIG. 7B

| Process ID | Frequency group |
|---|---|
| 1 | $f_{11}, f_{21}, f_{31}, f_{41}, \ldots, f_{N1}$ |
| 2 | $f_{12}, f_{22}, f_{32}, f_{42}, \ldots, f_{N2}$ |
| $\cdots$ | $\cdots$ |
| X | $f_{1X}, f_{2X}, f_{3X}, f_{4X}, \ldots, f_{NX}$ |

PLASMA PROCESSING APPARATUS, POWER SUPPLY SYSTEM, CONTROL METHOD, PROGRAM, AND STORAGE MEDIUM

CROSS REFERENCE TO RELATED APPLICATIONS

This application is a Continuation of PCT International Application No. PCT/JP2022/048006, filed on Dec. 26, 2022, which claims priority under 35 U.S.C. § 119(a) to Patent Application No. JP2022-001662, filed in Japan on Jan. 7, 2022, all of which are hereby expressly incorporated by reference into the present application.

FIELD

Exemplary embodiments of the disclosure relate to a plasma processing apparatus, a power supply system, a control method, a program, and a storage medium.

BACKGROUND

A plasma processing apparatus is used to perform plasma processing on substrates. The plasma processing apparatus uses bias radio-frequency power to draw ions in plasma generated in a chamber to a substrate. Patent Literature 1 below describes a plasma processing apparatus that modulates the power level and the frequency of bias radio-frequency power.

CITATION LIST

Patent Literature

Patent Literature 1: Japanese Unexamined Patent Application Publication No. 2009-246091

SUMMARY

Technical Problem

One or more aspects of the disclosure are directed to a technique for reducing the power level of a reflected wave of source radio-frequency power.

Solution to Problem

A plasma processing apparatus according to one exemplary embodiment includes a chamber, a substrate support, a bias power supply, and a radio-frequency power supply. The substrate support is in the chamber. The bias power supply is electrically coupled to the substrate support to generate electrical bias energy. The electrical bias energy has a bias frequency. The electrical bias energy has waveform cycles each having a duration being an inverse of the bias frequency. The radio-frequency power supply is electrically coupled to a radio-frequency electrode to generate source radio-frequency power to generate plasma from a gas in the chamber. The radio-frequency power supply selects an initial frequency group corresponding to a specified process. The radio-frequency power supply uses, in a first period, a plurality of frequencies included in the initial frequency group as a plurality of source frequencies of the source radio-frequency power for a respective plurality of phase periods in a waveform cycle of the electrical bias energy. The radio-frequency power supply adjusts, in a second period subsequent to the first period, the plurality of source frequencies of the source radio-frequency power for the respective plurality of phase periods in a waveform cycle of the electrical bias energy to decrease a power level of a reflected wave of the source radio-frequency power from a load.

Advantageous Effects

The technique according to the above exemplary embodiment reduces the power level of the reflected wave of the source radio-frequency power.

BRIEF DESCRIPTION OF DRAWINGS

FIGS. 7A and 7B are each a table of a database usable for the plasma processing apparatus according to one exemplary embodiment.

DETAILED DESCRIPTION

Figure 1:
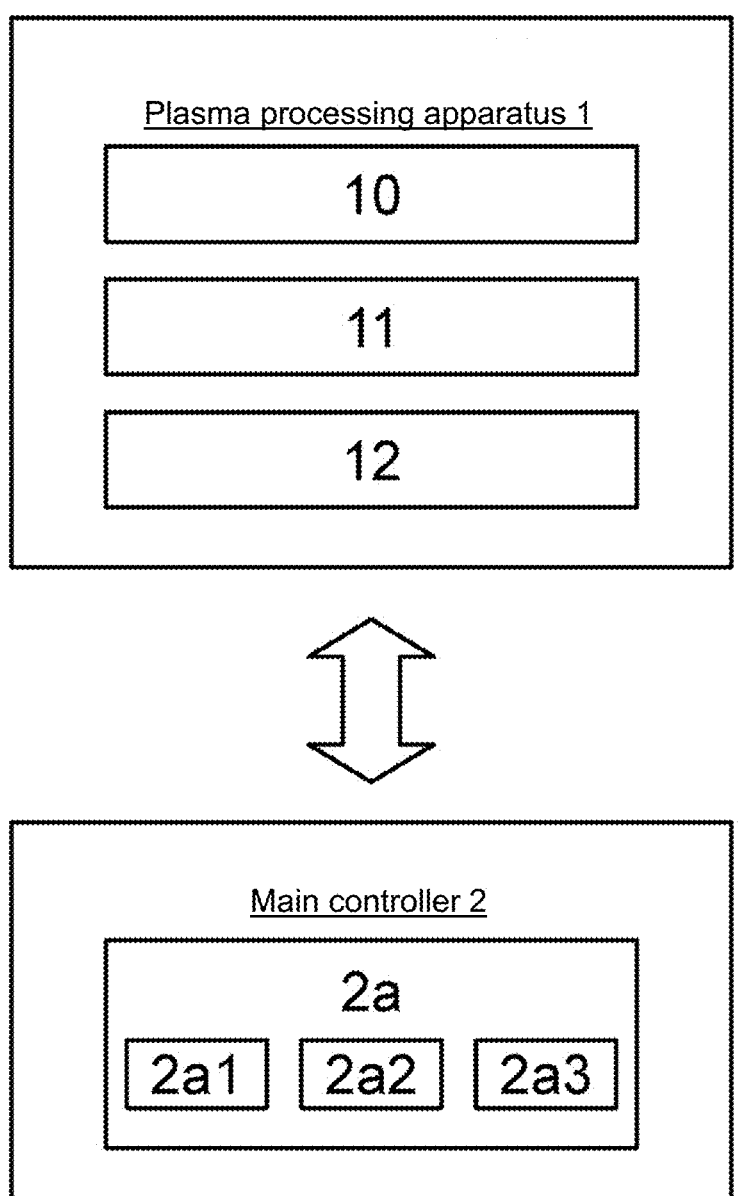
FIG. 1 is a diagram of a plasma processing system with an example structure.

Exemplary embodiments will now be described.

A plasma processing apparatus according to one exemplary embodiment includes a chamber, a substrate support, a bias power supply, and a radio-frequency power supply. The substrate support is in the chamber. The bias power supply is electrically coupled to the substrate support to generate electrical bias energy. The electrical bias energy has a bias frequency. The electrical bias energy has waveform cycles each having a duration being an inverse of the bias frequency. The radio-frequency power supply is electrically coupled to a radio-frequency electrode to generate source radio-frequency power to generate plasma from a gas in the chamber. The radio-frequency power supply selects an initial frequency group corresponding to a specified process. The radio-frequency power supply uses, in a first period, a plurality of frequencies included in the initial frequency group as a plurality of source frequencies of the source radio-frequency power for a respective plurality of phase periods in a waveform cycle of the electrical bias energy. The radio-frequency power supply adjusts, in a second period subsequent to the first period, the plurality of source frequencies of the source radio-frequency power for the respective plurality of phase periods in a waveform cycle of the electrical bias energy to decrease a power level of a reflected wave of the source radio-frequency power from a load.

In the above embodiment, in the first period, the plurality of frequencies included in the initial frequency group corresponding to the specified process are used as the frequencies for the respective plurality of phase periods in a waveform cycle of the electrical bias energy. This can promptly decrease the power level of the reflected wave of the source radio-frequency power while the specified process is being performed. In the second period subsequent to the first period, the plurality of source frequencies of the source radio-frequency power for the respective plurality of phase periods in a waveform cycle of the electrical bias energy are adjusted to further decrease the power level of the reflected wave of the source radio-frequency power from the load.

In one exemplary embodiment, the radio-frequency power supply may select the initial frequency group from a plurality of frequency groups corresponding to a respective plurality of processes. When the plurality of frequency groups include a frequency group corresponding to the specified process, the radio-frequency power supply may select, as the initial frequency group, the frequency group corresponding to the specified process.

In one exemplary embodiment, the waveform cycle of the electrical bias energy may be repeated in the second period. The radio-frequency power supply may update the frequency group corresponding to the specified process with a frequency group including a plurality of source frequencies of the source radio-frequency power for the respective plurality of phase periods obtained through repeated waveform cycles.

In one exemplary embodiment, the plurality of frequency groups may be stored in a database in a manner associated with a plurality of process condition datasets for the respective plurality of processes.

In one exemplary embodiment, the database may be included in a server accessible by the plasma processing apparatus or by the plasma processing apparatus and another plasma processing apparatus through communication.

In one exemplary embodiment, each of the plurality of process condition datasets may include a plurality of condition items.

In one exemplary embodiment, the database may store a transformation matrix. The transformation matrix minimizes an error between an output matrix and a matrix having a plurality of columns representing the plurality of frequency groups. The output matrix is a product of the transformation matrix and an input matrix having a plurality of columns representing the plurality of process condition datasets.

In one exemplary embodiment, the transformation matrix may be updated in response to an update of the frequency group corresponding to the specified process. The transformation matrix may be updated to minimize an error between an output matrix and a matrix having a plurality of columns representing the plurality of frequency groups including the updated frequency group. The output matrix is a product of the updated transformation matrix and the input matrix.

In one exemplary embodiment, when the plurality of frequency groups include no frequency group corresponding to the specified process, the radio-frequency power supply may generate an initial frequency group. The radio-frequency power supply may select, as the initial frequency group, a frequency group being a product of the transformation matrix and a process condition dataset for the specified process.

In one exemplary embodiment, each of the plurality of process condition datasets may include, as the plurality of condition items, a pressure in the chamber, a power level of the source radio-frequency power, at least one parameter of the electrical bias energy, and a flow rate of each of one or more gases to be supplied into the chamber.

In one exemplary embodiment, the electrical bias energy may include bias radio-frequency power having the bias frequency or a pulse of a voltage cyclically generated at a time interval with a duration being the inverse of the bias frequency. The at least one parameter of the electrical bias energy may include type information indicating whether the electrical bias energy is the bias radio-frequency power or the pulse of the voltage, the bias frequency, a power level of the bias radio-frequency power, a duty cycle of the pulse of the voltage, or a voltage level of the pulse of the voltage.

In one exemplary embodiment, the plasma processing apparatus may further include a matcher including a matching circuit between the radio-frequency power supply and the radio-frequency electrode. Each of the plurality of process condition datasets may further include, as the plurality of condition items, a capacitance of at least one variable capacitor in the matching circuit.

In one exemplary embodiment, the plasma processing apparatus may be a capacitively coupled plasma processing apparatus. The plasma processing apparatus may further include an upper electrode above the substrate support and a direct current power supply coupled to the upper electrode. Each of the plurality of process condition datasets may further include, as the plurality of condition items, a voltage level of a direct current voltage to be applied from the direct current power supply to the upper electrode.

In one exemplary embodiment, the radio-frequency power supply may use, as a source frequency in an n-th phase period of the plurality of phase periods in an m-th waveform cycle of the electrical bias energy in the second period, a frequency resulting from a frequency shift from a source frequency of the source radio-frequency power in the n-th phase period in a waveform cycle of the electrical bias energy preceding the m-th waveform cycle to decrease the power level of the reflected wave, where n is 1 to N, and N is a number of the plurality of phase periods in a waveform cycle of the electrical bias energy.

In one exemplary embodiment, the radio-frequency power supply may sequentially switch a source frequency of the source radio-frequency power among a plurality of candidate frequencies in an n-th phase period of the plurality of phase periods in a waveform cycle of the electrical bias energy in the second period. The radio-frequency power supply may select, from the plurality of candidate frequencies, a frequency minimizing the power level of the reflected wave of the source radio-frequency power from the load as the source frequency of the source radio-frequency power in the n-th phase, where n is 1 to N, and Nis a number of the plurality of phase periods in a waveform cycle of the electrical bias energy.

A power supply system according to another exemplary embodiment includes a bias power supply and a radio-frequency power supply. The bias power supply generates electrical bias energy to be provided to a substrate support in a chamber in a plasma processing apparatus. The electrical bias energy has a bias frequency. The electrical bias energy has waveform cycles each having a duration being an inverse of the bias frequency. The radio-frequency power supply generates source radio-frequency power to be provided to a radio-frequency electrode to generate plasma from a gas in the chamber. The radio-frequency power supply selects an initial frequency group corresponding to a specified process from a plurality of frequency groups corresponding to a respective plurality of processes. The radio-frequency power supply uses, in a first period, a plurality of frequencies included in the initial frequency group as a plurality of source frequencies of the source radio-frequency power for a respective plurality of phase periods in a waveform cycle of the electrical bias energy. The radio-frequency power supply adjusts, in a second period subsequent to the first period, the plurality of source frequencies of the source radio-frequency power for the respective plurality of phase periods in a waveform cycle of the electrical bias energy to decrease a power level of a reflected wave of the source radio-frequency power from a load.

A control method according to still another exemplary embodiment includes (a) providing electrical bias energy having a bias frequency from a bias power supply to a substrate support in a chamber in a plasma processing apparatus. The electrical bias energy has a bias frequency. The electrical bias energy has waveform cycles each having a duration being an inverse of the bias frequency. The control method further includes (b) providing source radio-frequency power from a radio-frequency power supply to a radio-frequency electrode to generate plasma from a gas in the chamber. The above (b) includes selecting an initial frequency group corresponding to a specified process from a plurality of frequency groups corresponding to a respective plurality of processes. The above (b) further includes using, in a first period, a plurality of frequencies included in the initial frequency group as a plurality of source frequencies of the source radio-frequency power for a respective plurality of phase periods in a waveform cycle of the electrical bias energy. The above (b) further includes adjusting, in a second period subsequent to the first period, the plurality of source frequencies of the source radio-frequency power for the respective plurality of phase periods in a waveform cycle of the electrical bias energy to decrease a power level of a reflected wave of the source radio-frequency power from a load.

A program according to still another exemplary embodiment is executable by a computer in a plasma processing apparatus to implement the above control method. A storage medium according to still another exemplary embodiment stores the program.

Exemplary embodiments will now be described in detail with reference to the drawings. In the figures, like reference numerals denote like or corresponding components.

FIG. 1 is a diagram of a plasma processing system with an example structure. In one embodiment, the plasma processing system includes a plasma processing apparatus 1 and a main controller 2. The plasma processing system is an example of a substrate processing system. The plasma processing apparatus 1 is an example of a substrate processing apparatus. The plasma processing apparatus 1 includes a plasma processing chamber 10, a substrate support 11, and a plasma generator 12. The plasma processing chamber 10 has a plasma processing space. The plasma processing chamber 10 has at least one gas inlet for receiving at least one process gas supplied into the plasma processing space and at least one gas outlet for discharging the gas from the plasma processing space. The gas inlet is connected to a gas supply 20 (described later). The gas outlet is connected to an exhaust system 40 (described later). The substrate support 11 is located in the plasma processing space and has a substrate support surface for supporting a substrate.

The plasma generator 12 generates plasma from at least one process gas supplied into the plasma processing space. The plasma generated in the plasma processing space may be, for example, capacitively coupled plasma (CCP), inductively coupled plasma (ICP), electron cyclotron resonance (ECR) plasma, helicon wave plasma (HWP), or surface wave plasma (SWP).

The main controller 2 processes computer-executable instructions that cause the plasma processing apparatus 1 to perform various steps described in one or more embodiments of the disclosure. The main controller 2 may control the components of the plasma processing apparatus 1 to perform the various steps described herein. In one embodiment, some or all of the components of the main controller 2 may be included in the plasma processing apparatus 1. The main controller 2 may include a processor 2a1, a storage 2a2, and a communication interface 2a3. The main controller 2 is implemented by, for example, a computer 2a. The processor 2a1 may perform various control operations by loading a program from the storage 2a2 and executing the loaded program. The program includes computer-executable instructions that cause the plasma processing apparatus 1 to perform various steps included in a control method according to an exemplary embodiment (described later). The program may be prestored in the storage 2a2 or may be obtained through a medium as appropriate. The obtained program is stored into the storage 2a2 to be loaded from the storage 2a2 and executed by the processor 2a1. The medium may be one of various storage media readable by the computer 2a, or a communication line connected to the communication interface 2a3. The processor 2a1 may be a central processing unit (CPU). The storage 2a2 may include a random-access memory (RAM), a read-only memory (ROM), a hard disk drive (HDD), a solid-state drive (SSD), or a combination of these. The communication interface 2a3 may communicate with the plasma processing apparatus 1 through a communication line such as a local area network (LAN).

Figure 2:
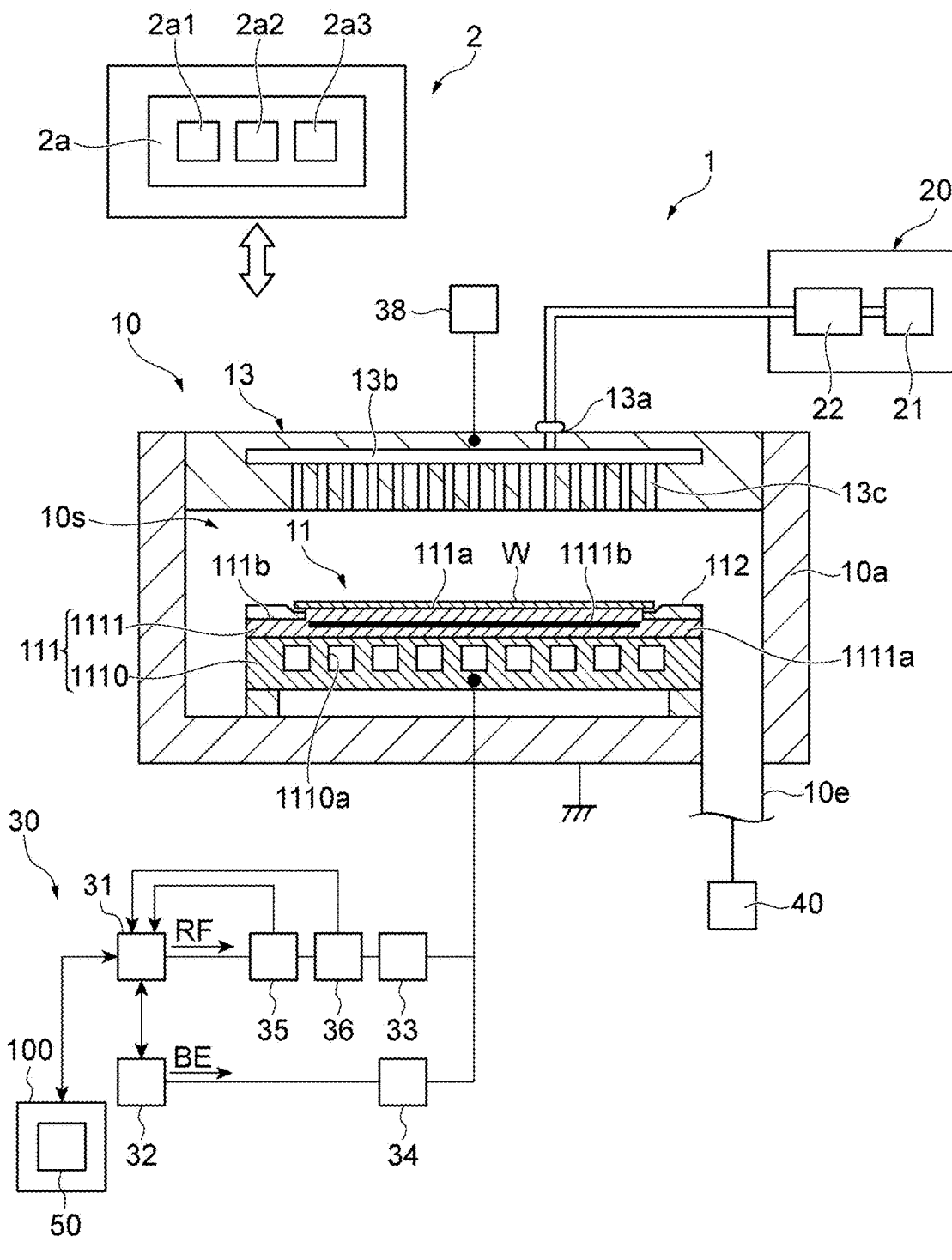
FIG. 2 is a diagram of a capacitively coupled plasma processing apparatus with an example structure.

An example structure of a capacitively coupled plasma processing apparatus as an example of the plasma processing apparatus 1 will now be described. FIG. 2 is a diagram of the capacitively coupled plasma processing apparatus with the structure.

The capacitively coupled plasma processing apparatus 1 includes the plasma processing chamber 10, the gas supply 20, a power supply system 30, and the exhaust system 40. The plasma processing apparatus 1 also includes the substrate support 11 and a gas inlet unit. The gas inlet unit allows at least one process gas to be introduced into the plasma processing chamber 10. The gas inlet unit includes a shower head 13. The substrate support 11 is located in the plasma processing chamber 10. The shower head 13 is located above the substrate support 11. In one embodiment, the shower head 13 defines at least a part of the ceiling of the plasma processing chamber 10. The plasma processing chamber 10 has a plasma processing space 10s defined by the shower head 13, a side wall 10a of the plasma processing chamber 10, and the substrate support 11. The plasma processing chamber 10 is grounded. The shower head 13 and the substrate support 11 are electrically insulated from the housing of the plasma processing chamber 10.

The substrate support 11 includes a body 111 and a ring assembly 112, the ring assembly 112 can be disposed (e.g., positioned) directly on the body 111, such as a top surface of the body 111, and on a groove (e.g., channel, indentation, etc.) portion of the top surface of the body 111. The body 111 includes a central portion 111a for supporting a substrate W and an annular portion 111b for supporting the ring assembly 112. The substrate W is, for example, a wafer (e.g., semiconductor, as known in the art). The annular portion 111b of the body 111 surrounds the central portion 111a of the body 111 as viewed in plan. The substrate W is placed on the central portion 111a of the body 111. The ring assembly 112 is placed on the annular portion 111b of the body 111 to surround the substrate W on the central portion 111a of the body 111. Thus, the central portion 111a is also referred to as a substrate support surface for supporting the substrate W. The annular portion 111b is also referred to as a ring support surface for supporting the ring assembly 112.

In one embodiment, the body 111 includes a base 1110 and an electrostatic chuck (ESC) 1111. The base 1110 includes a conductive member. The ESC 1111 is located on the base 1110. The ESC 1111 includes a ceramic member 1111a and an electrostatic electrode 1111b inside the ceramic member 1111a. The ceramic member 1111a includes the central portion 111a. In one embodiment, the ceramic member 1111a also includes the annular portion 111b. The annular portion 111b may be included in a separate member surrounding the ESC 1111, such as an annular ESC or an annular insulating member. In this case, the ring assembly 112 may be located on the annular ESC or the annular insulating member, or may be located on both the ESC 1111 and the annular insulating member.

The ring assembly 112 includes one or more annular members. In one embodiment, one or more annular members include one or more edge rings and at least one cover ring. The edge ring is formed from a conductive material or an insulating material. The cover ring is formed from an insulating material.

The substrate support 11 may also include a temperature control module that adjusts the temperature of at least one of the ESC 1111, the ring assembly 112, or the substrate to a target temperature. The temperature control module may include a heater, a heat transfer medium, a channel 1110a, or a combination of these. The channel 1110a allows a flow of a heat transfer fluid such as brine or gas through it. In one embodiment, the channel 1110a is defined in the base 1110, and one or more heaters are located in the ceramic member 1111a in the ESC 1111. The substrate support 11 may include a heat transfer gas supply to supply a heat transfer gas into a space between the back surface of the substrate W and the central portion 111a.

The shower head 13 introduces at least one process gas from the gas supply 20 into the plasma processing space 10s. The shower head 13 has at least one gas inlet 13a, at least one gas-diffusion compartment 13b, and multiple gas guides 13c. The process gas supplied to the gas inlet 13a passes through the gas-diffusion compartment 13b and is introduced into the plasma processing space 10s through the multiple gas guides 13c. The shower head 13 also includes at least one upper electrode. In addition to the shower head

13, the gas inlet 13a may include one or more side gas injectors (SGIs) installed in one or more openings in the side wall 10a.

The gas supply 20 may include at least one gas source 21 and at least one flow controller 22. In one embodiment, the gas supply 20 allows supply of at least one process gas from the corresponding gas source 21 to the shower head 13 through the corresponding flow controller 22. The flow controller 22 may include, for example, a mass flow controller or a pressure-based flow controller. The gas supply 20 may further include at least one flow rate modulator that allows supply of at least one process gas at a modulated flow rate or in a pulsed manner.

The exhaust system 40 is connectable to, for example, a gas outlet 10e in the bottom of the plasma processing chamber 10. The exhaust system 40 may include a pressure control valve and a vacuum pump. The pressure control valve regulates the pressure in the plasma processing space 10s. The vacuum pump may include a turbomolecular pump, a dry pump, or a combination of these.

Figure 3:
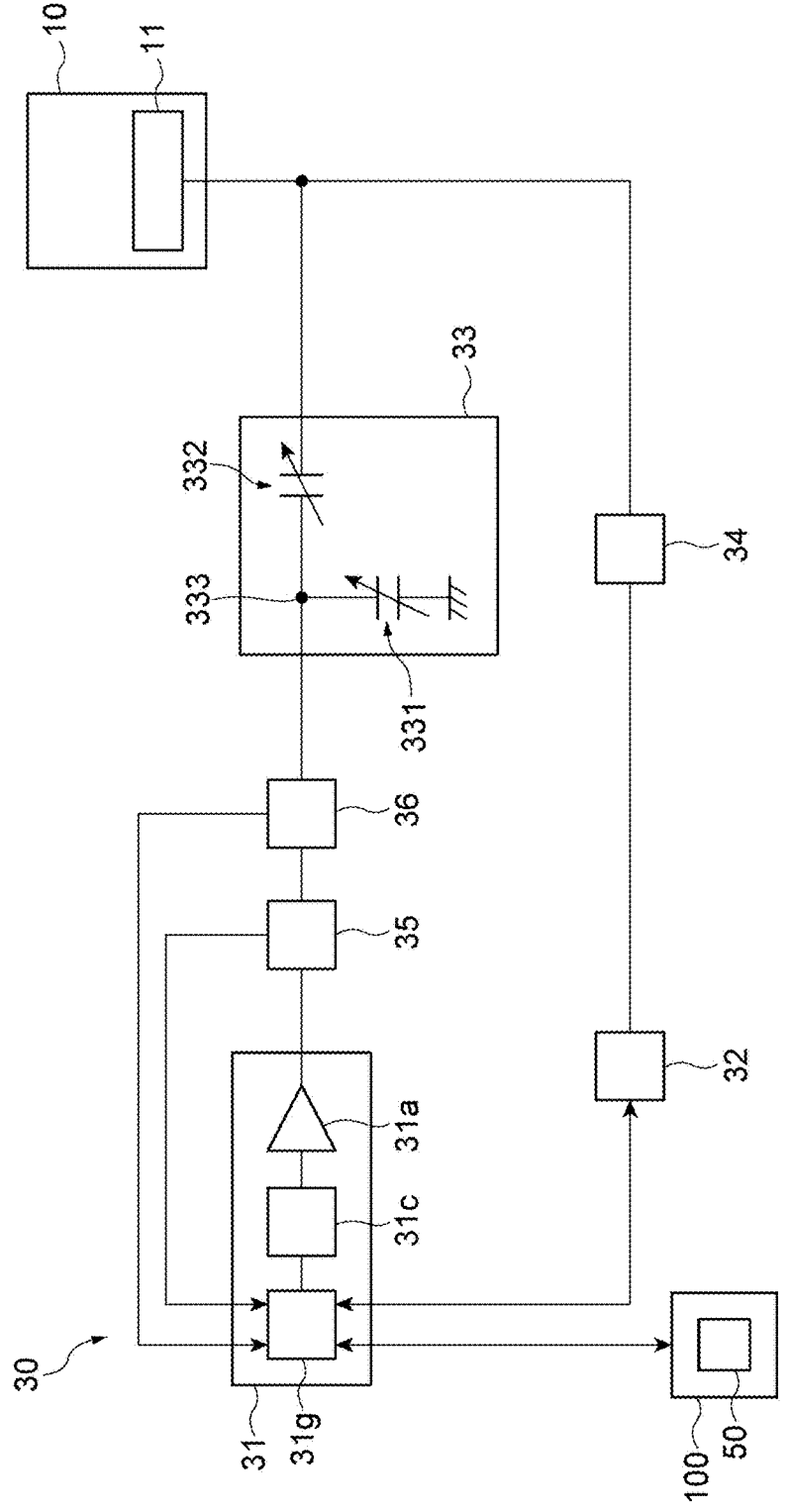
FIG. 3 is a schematic diagram of a plasma processing apparatus according to one exemplary embodiment.

FIG. 3 will now be referred to in addition to FIG. 2. FIG. 3 is a schematic diagram of the plasma processing apparatus according to one exemplary embodiment. As shown in FIGS. 2 and 3, the power supply system 30 includes a radio-frequency (RF) power supply 31 and a bias power supply 32.

The RF power supply 31 serves as the plasma generator 12 in one embodiment. The RF power supply 31 generates source radio-frequency power RF. The source radio-frequency power RF has a source frequency $f_{RF}$. More specifically, the source radio-frequency power RF has a sinusoidal waveform with its frequency being the source frequency $f_{RF}$. The source frequency $f_{RF}$ may be within a range of 10 to 150 MHz. The RF power supply 31 is electrically coupled to an RF electrode through a matcher 33 to provide the source radio-frequency power RF to the RF electrode. The RF electrode may be the conductive member in the base 1110, may be at least one electrode in the ceramic member 1111a, or may be the upper electrode. In response to the source radio-frequency power RF provided to the RF electrode, plasma is generated from the gas in the chamber 10.

The matcher 33 includes a matching circuit. The matching circuit in the matcher 33 has a variable impedance. The matching circuit in the matcher 33 may include a first variable capacitor 331 and a second variable capacitor 332. The first variable capacitor 331 is coupled between a node 333 and the ground. The node 333 is located on a feed line coupling the RF power supply 31 and the RF electrode. The source radio-frequency power RF is provided to the RF electrode through the feed line. The second variable capacitor 332 is coupled between the node 333 and the RF electrode. A capacitance C1 of the first variable capacitor 331 and a capacitance C2 of the second variable capacitor 332 are controlled by the main controller 2. The matcher 33 has a variable impedance that is set, for example, to reduce reflection of the source radio-frequency power RF from a load.

In one embodiment, the RF power supply 31 may include a signal generator 31g, a digital-to-analog (D/A) converter 31c, and an amplifier 31a. The signal generator 31g generates an RF signal. The signal generator 31g may include a processor. The D/A converter 31c performs D/A conversion on the RF signal (digital signal) output from the signal generator 31g. The amplifier 31a amplifies the RF signal (analog signal) from the D/A converter 31c to generate the source radio-frequency power RF.

The bias power supply 32 generates electrical bias energy BE. The bias power supply 32 is electrically coupled to the substrate support 11. The bias power supply 32 is electrically coupled to a bias electrode in the substrate support 11 to provide the electrical bias energy BE to the bias electrode. The bias electrode may be the conductive member in the base 1110 or may be at least one electrode in the ceramic member 1111$a$. The electrical bias energy BE provided to the bias electrode attracts ions in the plasma to the substrate W.

The electrical bias energy BE has a bias frequency. The bias frequency is lower than the source frequency. The bias frequency may be within a range of 100 kHz to 60 MHz, or for example, 400 kHz. The electrical bias energy BE has waveform cycles, or cycles CY. Each cycle CY has a duration being the inverse of the bias frequency. The electrical bias energy BE is cyclically provided to the bias electrode in cycles CY (at time intervals).

Figure 4:
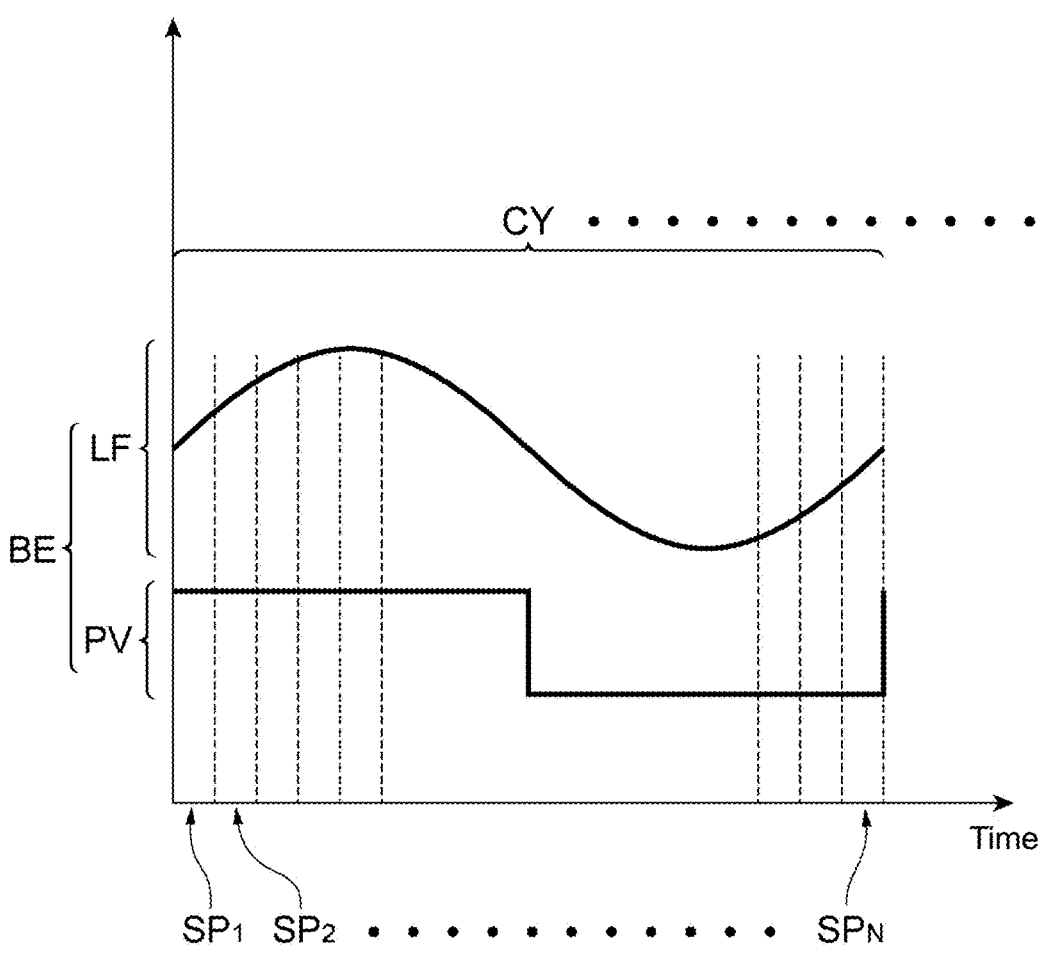
FIG. 4 is an example timing chart of electrical bias energy, showing its waveforms.

FIG. 4 will now be referred to in addition to FIGS. 2 and 3. FIG. 4 is an example timing chart of electrical bias energy, showing its waveforms. The electrical bias energy BE may be bias RF power LF having the bias frequency. In other words, the electrical bias energy BE may have a sinusoidal waveform with its frequency being the bias frequency. In this case, the bias power supply 32 is electrically coupled to the bias electrode through a matcher 34. A matching circuit in the matcher 34 has a variable impedance that is set, for example, to reduce reflection of the bias RF power LF from the load.

In some embodiments, the electrical bias energy BE may include a pulse PV of a voltage cyclically generated at a time interval of the cycle CY. The waveform of the pulse PV of the electrical bias energy BE may be rectangular, triangular, or in any other shape. The pulse PV of the voltage of the electrical bias energy BE has polarity that causes a potential difference between the plasma and the substrate W to draw ions in the plasma to the substrate W. For example, the pulse PV of the electrical bias energy BE may be a pulse of a negative voltage. The pulse PV of the electrical bias energy BE may be a pulse of a direct current (DC) voltage from a DC power supply with its waveform shaped by a pulse unit.

As shown in FIG. 2, the plasma processing apparatus 1 may further include a power supply 38 electrically coupled to the upper electrode to apply a negative DC voltage. The power supply 38 may be a DC power supply.

As shown in FIGS. 2 and 3, the plasma processing apparatus 1 further includes a sensor 35 and a sensor 36. The sensor 35 measures a power level Pr of the reflected wave of the source radio-frequency power RF from the load. The sensor 35 includes, for example, a directional coupler and an analog-to-digital (A/D) converter. The directional coupler may be located between the RF power supply 31 and the matcher 33. The A/D converter generates a digital value of the power level Pr measured by the directional coupler. The sensor 35 notifies the RF power supply 31 of the measured power level Pr (digital value) of the reflected wave. The sensor 35 may also notify the RF power supply 31 of a power level Pf (digital value) of the traveling wave.

The sensor 36 includes a voltage sensor and a current sensor. The sensor 36 measures a voltage $V_{RF}$ and a current $I_{RF}$ on the feed line coupling the RF power supply 31 and the RF electrode. The source radio-frequency power RF is provided to the RF electrode through the feed line. The sensor 36 may be located between the RF power supply 31 and the matcher 33. The sensor 36 further includes an A/D converter. The A/D converter generates digital values of the voltage $V_{RF}$ and the current $I_{RF}$ measured by the voltage sensor and the current sensor. The RF power supply 31 is notified of the voltage $V_{RF}$ (digital value) and the current $I_{RF}$ (digital value).

Figure 5A:
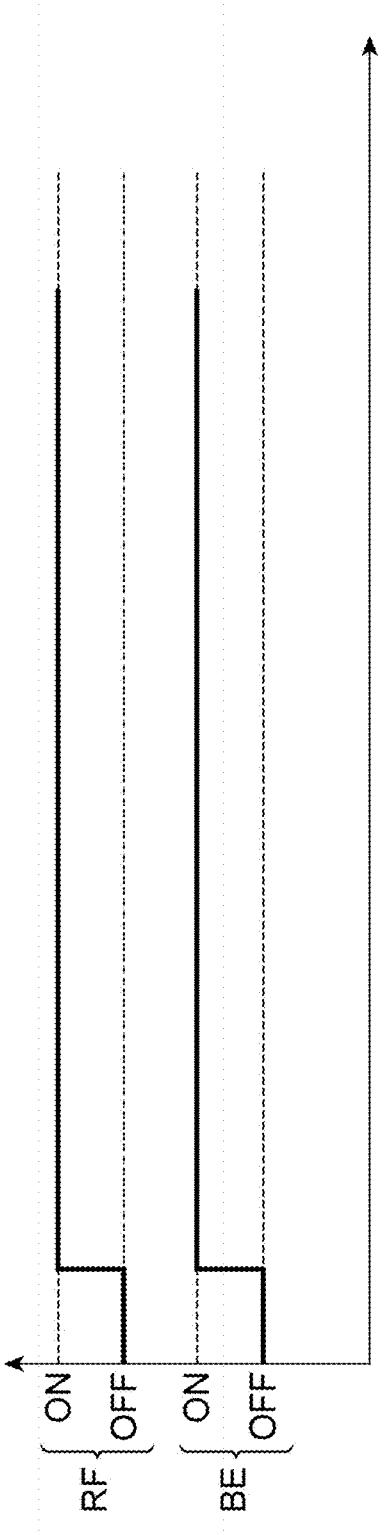
FIGS. 5A and 5B are each a timing chart of source radio-frequency power and electrical bias energy in the plasma processing apparatus according to one exemplary embodiment.
Figure 5B:
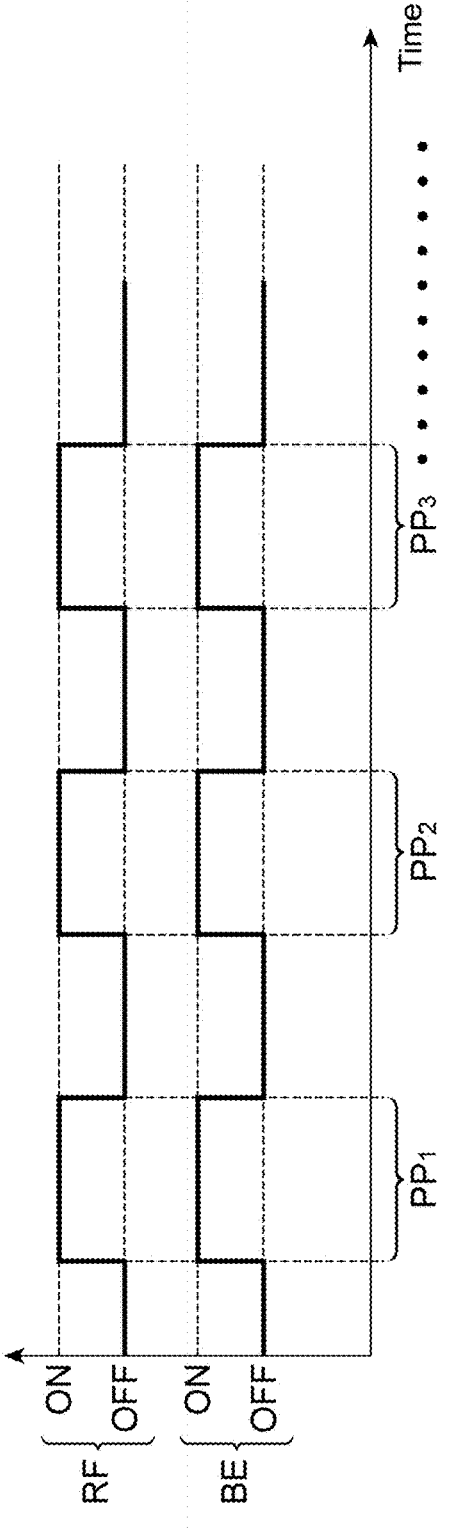

FIGS. 5A and 5B will now be referred to in addition to FIGS. 2 and 3. FIGS. 5A and 5B are each a timing chart of source radio-frequency power and electrical bias energy in the plasma processing apparatus according to one exemplary embodiment. In the figures, the source radio-frequency power RF being ON indicates the source radio-frequency power RF being provided, and the source radio-frequency power RF being OFF indicates the source radio-frequency power RF being stopped. In the figures, the electrical bias energy BE being ON indicates the electrical bias energy BE being provided, and the electrical bias energy BE being OFF indicates the electrical bias energy BE being stopped.

The RF power supply 31 provides the source radio-frequency power RF in parallel with the bias power supply 32 cyclically providing the electrical bias energy BE. More specifically, as shown in FIG. 5A, the electrical bias energy BE and the source radio-frequency power RF may be provided simultaneously and continuously from the start to the end of the process. The period from the start to the end of the process, or the period in which the electrical bias energy BE and the source radio-frequency power RF are provided simultaneously and continuously, is referred to as a continuous power supply period Pc.

In some embodiments, as shown in FIG. 5B, the electrical bias energy BE and the source radio-frequency power RF may be provided with their pulses being synchronized. More specifically, the electrical bias energy BE and the source radio-frequency power RF may be provided simultaneously in pulse periods $PP_1$, $PP_2$, and $PP_3$, . . . (or multiple pulse periods PP). Each of the multiple pulse periods PP includes multiple cycles CY. In other words, the electrical bias energy BE is cyclically provided in each of the multiple pulse periods PP.

The RF power supply 31 adjusts the source frequency $f_{RF}$ of the source radio-frequency power RF for each of multiple phase periods SP in each cycle CY. The RF power supply 31 may adjust the source frequency $f_{RF}$ by adjusting the frequency of the RF signal with the signal generator 31$g$. The multiple phase periods SP are periods into which a cycle CY is divided. As shown in FIG. 4, each cycle CY is divided into multiple phase periods $SP_1$ to $SP_N$, where N is the number of phase periods in each cycle CY.

The RF power supply 31 is synchronized with the bias power supply 32 using a synchronization signal to set the source frequency $f_{RF}$ for each of the multiple phase periods SP. The synchronization signal may be provided from the RF power supply 31 (or the signal generator 31$g$) to the bias power supply 32 or from the bias power supply 32 to the RF power supply 31. In some embodiments, the synchronization signal may be provided from another device to the RF power supply 31 and the bias power supply 32.

Figure 6:
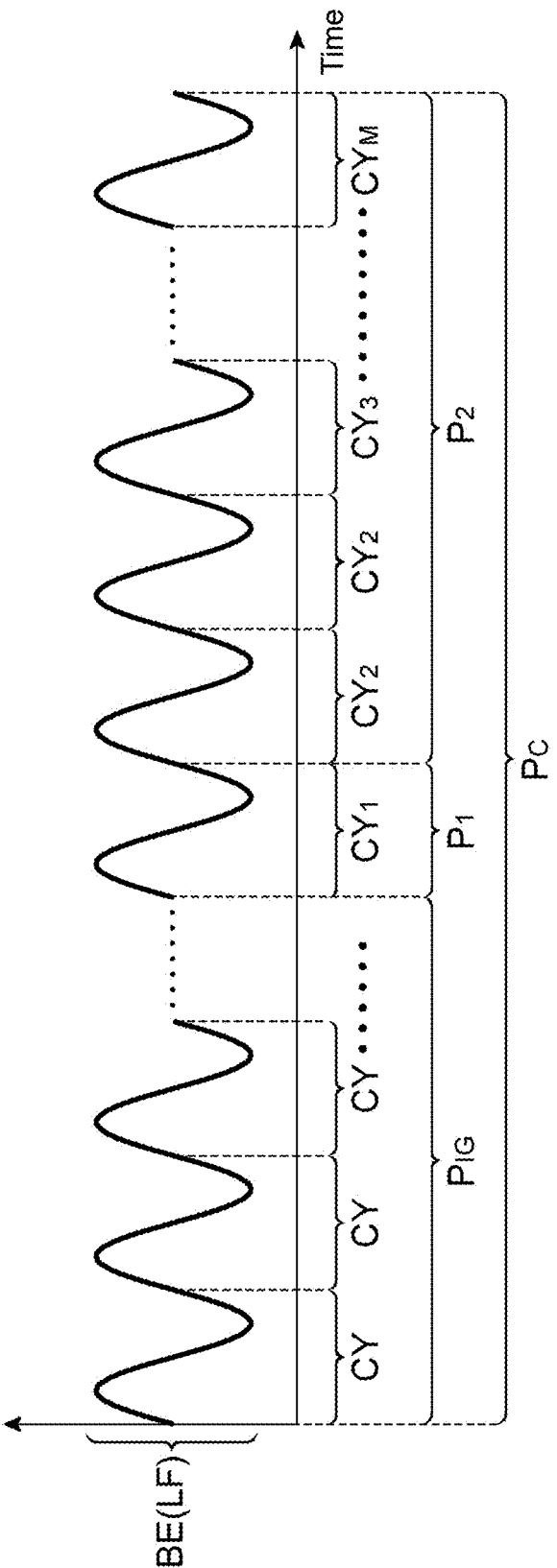
FIG. 6 is a waveform chart of electrical bias energy in the plasma processing apparatus according to one exemplary embodiment.

FIG. 6 is a waveform chart of electrical bias energy in the plasma processing apparatus according to one exemplary embodiment. As shown in FIG. 6, the continuous power supply period Pc includes a first period $P_1$ and a second period $P_2$. The first period $P_1$ includes at least one cycle CY. In the illustrated example, the first period $P_1$ includes one cycle $CY_1$. The second period $P_2$ is subsequent to the first period $P_1$ and includes multiple cycles CY. In the illustrated example, the second period $P_2$ includes cycles $CY_2$ to $CY_M$. The continuous power supply period Pc may further include an ignition period $P_{IG}$. The ignition period $P_{IG}$ precedes the first period $P_1$ and includes at least one cycle CY.

In the ignition period $P_{IG}$, the RF power supply 31 uses the multiple frequencies included in a frequency group predefined for the ignition period $P_{IG}$ as the multiple source frequencies $f_{RF}$ for the respective multiple phase periods SP in each cycle CY. The frequency group for the ignition period $P_{IG}$ may be stored in a database 50 (described later), may be stored in the storage $2a2$ in the main controller 2, or may be stored in a storage in the RF power supply 31.

In the first period $P_1$, the RF power supply 31 uses the multiple frequencies included in an initial frequency group as the multiple source frequencies $f_{RF}$ for the respective multiple phase periods SP in each cycle CY. When multiple frequency groups stored in the database 50 include the frequency group corresponding to a process specified by the main controller 2, the RF power supply 31 selects, as the initial frequency group, the frequency group corresponding to the specified process. The database 50 may be included in the storage $2a2$, or may be included in the storage in the RF power supply 31. In some embodiments, the database 50 may be included in a server 100 accessible by the plasma processing apparatus 1 or by the plasma processing apparatus 1 and another plasma processing apparatus through communication.

FIGS. 7A and 7B are each a table of the database usable for the plasma processing apparatus according to one exemplary embodiment. As shown in FIGS. 7A and 7B, the database 50 associates the multiple frequency groups with multiple process condition datasets for multiple processes. In the illustrated example, the multiple process IDs identifying the multiple processes are associated with the multiple process condition datasets for the respective processes. The multiple process IDs identifying the multiple processes are associated with the multiple frequency groups for the respective processes.

In the example shown in FIG. 7A, the database 50 stores X process condition datasets. Each process condition dataset includes Y condition items. For example, the process condition dataset for the process with the process ID of 1 includes condition items $b_{11}$ to $b_{Y1}$. The process condition dataset for the process with the process ID of X includes condition items $b_{1X}$ to $b_{YX}$. The multiple condition items in each process condition dataset may include the pressure in the chamber 10, the power level of the source radio-frequency power RF, at least one parameter of the electrical bias energy BE, and the flow rate of each of one or more gases to be supplied into the chamber 10. The parameter of the electrical bias energy BE may include type information indicating whether the electrical bias energy BE is the bias RF power LF or the pulse PV of the voltage, the bias frequency, the power level of the bias RF power LF, the duty cycle of the pulse PV of the voltage, and the voltage level of the pulse PV of the voltage. The identification information indicates a numerical value identifying the type of electrical bias energy BE (the bias RF power LF or the pulse PV of the voltage). The multiple condition items in each process condition dataset may further include the capacitance C1, the capacitance C2, or both. The multiple condition items in each process condition dataset may further include the voltage level of the DC voltage to be applied from the power supply 38 to the upper electrode.

In the example shown in FIG. 7B, the database 50 stores X frequency groups. Each frequency group includes N frequencies. For example, the frequency group for the process with the process ID of 1 includes frequencies $f_{11}$ to $f_{X1}$. The frequency group for the process with the process ID of X includes frequencies $f_{1X}$ to $f_{NX}$. Each frequency group includes the multiple source frequencies $f_{RF}$ that are predefined for the corresponding process to reduce the power levels of the reflected wave of the source radio-frequency power RF from the load for the respective phase periods SP in each cycle CY.

When the database 50 stores no frequency group for the process (process ID) specified by the main controller 2, the RF power supply 31 may select another frequency group as the initial frequency group. For example, the RF power supply 31 may select, as the initial frequency group from the multiple frequency groups in the database 50, the frequency group corresponding to the process having the process condition dataset closest to the process condition dataset for the specified process. In some embodiments, the RF power supply 31 may select, as the initial frequency group, the frequency group being the product of a transformation matrix (described later) and the process condition dataset for the specified process.

In the second period $P_2$, the RF power supply 31 adjusts the multiple source frequencies $f_{RF}$ for the respective multiple phase periods SP in each cycle CY to reduce the power levels of the reflected wave of the source radio-frequency power RF from the load.

In a first example, the RF power supply 31 uses, as the source frequency $f_{RF}$ for the n-th phase period $SP_n$ in the m-th cycle $CY_m$ in the second period $P_2$, a frequency resulting from a frequency shift from the source frequency $f_{RF}$ for the phase period $SP_n$ in a cycle CY preceding the cycle $CY_m$ to reduce the power level of the reflected wave. The cycle CY preceding the cycle $CY_m$ is, for example, the cycle $CY_{m-1}$. Adjusting the source frequency $f_{RF}$ in the first example will be described in detail later.

In a second example, the RF power supply 31 sequentially switches the source frequency $f_{RF}$ among multiple candidate frequencies in the n-th phase period $SP_n$ in at least one cycle CY in the second period $P_2$. The RF power supply 31 selects, as the source frequency $f_{RF}$ for the phase period $SP_n$, one of the multiple candidate frequencies that minimizes the power level of the reflected wave of the source radio-frequency power RF from the load. The RF power supply 31 uses the source frequency $f_{RF}$ selected for the phase period $SP_n$ as the source frequency $f_{RF}$ for the phase period $SP_n$ in each of the other cycles CY in the second period $P_2$.

When the electrical bias energy BE and the source radio-frequency power RF are provided with their pulses being synchronized, each of the pulse periods $PP_1$ to PP includes the ignition period $P_{IG}$, the first period $P_1$, and the second period $P_2$, similarly to the continuous power supply period Pc. In each of the pulse periods $PP_1$ to $PP_J$, the RF power supply 31 sets the source frequencies $f_{RF}$ for the respective multiple phase periods SP in each cycle CY, similarly to the continuous power supply period Pc. In the first period $P_1$ in each of the pulse periods $PP_2$ to $PP_J$, the RF power supply 31 may use, as the initial frequency group, the multiple source frequencies $f_{RF}$ for the respective multiple phase periods SP obtained in the final cycle CY in the pulse period $PP_1$. The pulse period $PP_J$ may be the pulse period $PP_2$, or may be a pulse period subsequent to the pulse period $PP_2$.

Figure 8:
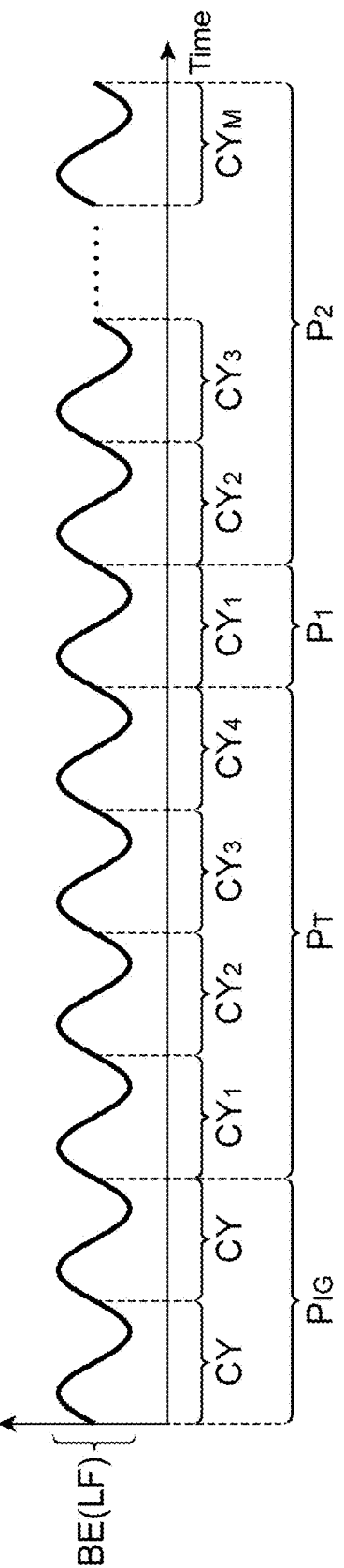
FIG. 8 is a waveform chart of electrical bias energy in the plasma processing apparatus according to one exemplary embodiment.

FIG. 8 is a waveform chart of electrical bias energy in the plasma processing apparatus according to one exemplary embodiment. As shown in FIG. 8, each of the pulse periods $PP_{J+1}$ to $PP_k$ includes the ignition period $P_{IG}$, the first period $P_1$, and the second period $P_2$, similarly to the continuous power supply period Pc. Each of the pulse periods $PP_J$. 1 to $PP_k$ further includes a transition period $P_T$ between the ignition period $P_{IG}$ and the first period $P_1$. The pulse period $PP_{J+1}$ may be the pulse period $PP_3$, or may be a pulse period subsequent to the pulse period $PP_3$.

In the ignition periods $P_{IG}$ in each of the pulse periods $PP_{J+1}$ to $PP_k$, the RF power supply 31 sets the source frequencies $f_{RF}$ for the respective multiple phase periods SP in each cycle CY, similarly to the pulse periods $PP_1$ to $PP_J$.

In each of the pulse periods $PP_{J+1}$ to $PP_k$ (pulse periods $PP_k$), the RF power supply 31 adjusts the source frequency $f_{RF}$ for each phase period SP in each cycle CY in the transition period $P_T$ based on the degree of reflection of the source radio-frequency power RF in the identical phase period SP in the identical cycle CY in a pulse period preceding the pulse period $PP_k$. The pulse period preceding the pulse period $PP_k$ is, for example, the immediately preceding pulse period, or the pulse period $PP_{k-1}$. Adjusting the source frequency $f_{RF}$ for each phase period SP in each cycle CY in the transition period $P_T$ will be described in detail later.

In the first period $P_1$ and the second period $P_2$ in each of the pulse periods $PP_{J+1}$ to $PP_k$ (pulse periods $PP_k$), the RF power supply 31 sets the source frequencies $f_{RF}$ for the respective multiple phase periods SP in each cycle CY, similarly to the first period $P_1$ and the second period $P_2$ in the pulse period $PP_J$. In the first period $P_1$ in the pulse period $PP_k$, the RF power supply 31 may use, as the initial frequency group, the multiple source frequencies $f_{RF}$ for the respective multiple phase periods SP obtained in the final cycle CY in the pulse period $PP_{k-1}$.

In the plasma processing apparatus 1, in the first period $P_1$, the multiple frequencies included in the initial frequency group corresponding to the specified process are used as the frequencies for the respective multiple phase periods SP in the cycle CY. This can promptly decrease the power level of the reflected wave of the source radio-frequency power RF while the specified process is being performed. In the second period $P_2$ subsequent to the first period $P_1$, the multiple source frequencies $f_{RF}$ for the respective multiple phase periods SP in each cycle CY are adjusted to further decrease the power level of the reflected wave of the source radio-frequency power RF from the load.

In one exemplary embodiment, the RF power supply 31 (or the signal generator 31g) may update the frequency group in the database 50 corresponding to the specified process. The frequency group in the database 50 corresponding to the specified process is updated with the frequency group including the multiple source frequencies $f_{RF}$ for the respective multiple phase periods SP finally obtained through repeated cycles CY.

Figures 9A, 9B:
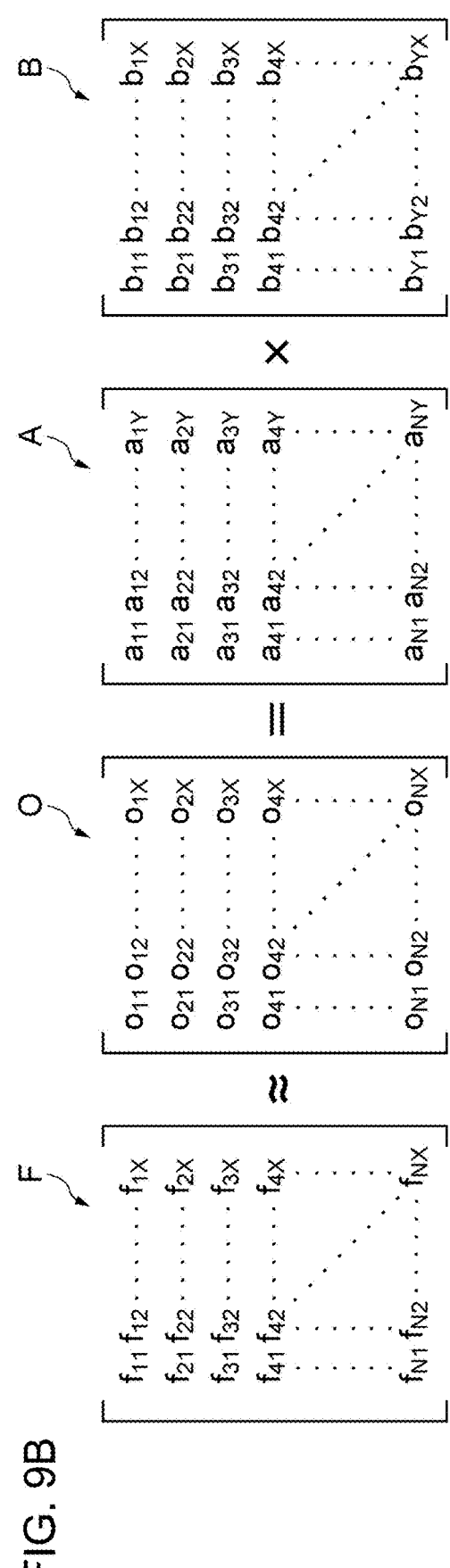
FIG. 9A is a diagram of the database usable for the plasma processing apparatus according to one exemplary embodiment.
FIG. 9B is a diagram describing a transformation matrix.

FIGS. 9A and 9B will now be referred to. FIG. 9A is a diagram of the database usable for the plasma processing apparatus according to one exemplary embodiment, and FIG. 9B is a diagram describing a transformation matrix. In one embodiment, the database 50 may further store a transformation matrix A shown in FIG. 9A. The transformation matrix A includes elements in N rows and Y columns. As shown in FIG. 9B, the transformation matrix A is set to minimize the error between a matrix F and an output matrix O. The output matrix O is the product of the transformation matrix A and an input matrix B. The input matrix B has multiple columns representing the multiple process condition datasets stored in the database 50. The matrix F has multiple columns representing the multiple frequency groups stored in the database 50. The transformation matrix A is calculated with, for example, the method of least squares. The transformation matrix A may be calculated in the RF power supply 31 (or the signal generator 31g), the main controller 2, or the server 100 and then stored into the database 50.

In one embodiment, the transformation matrix A may be updated in response to an update of the frequency group corresponding to the specified process. The transformation matrix A is updated to minimize the error between the matrix F, which has multiple columns representing multiple frequency groups including the updated frequency group, and the output matrix O, which is the product of the transformation matrix A and the input matrix B. The transformation matrix A is calculated with, for example, the method of least squares. The transformation matrix A may be calculated in the RF power supply 31 (or the signal generator 31g), the main controller 2, or the server 100 and then stored into the database 50.

The plasma processing apparatus 1 can thus easily obtain a frequency group including the multiple source frequencies $f_{RF}$ for the respective multiple phase periods SP in each cycle CY in a new process. More specifically, the frequency group including the multiple source frequencies $f_{RF}$ for the respective multiple phase periods SP in each cycle CY in the new process is the product of the transformation matrix A and the input matrix including the process condition dataset for the new process.

Figure 10:
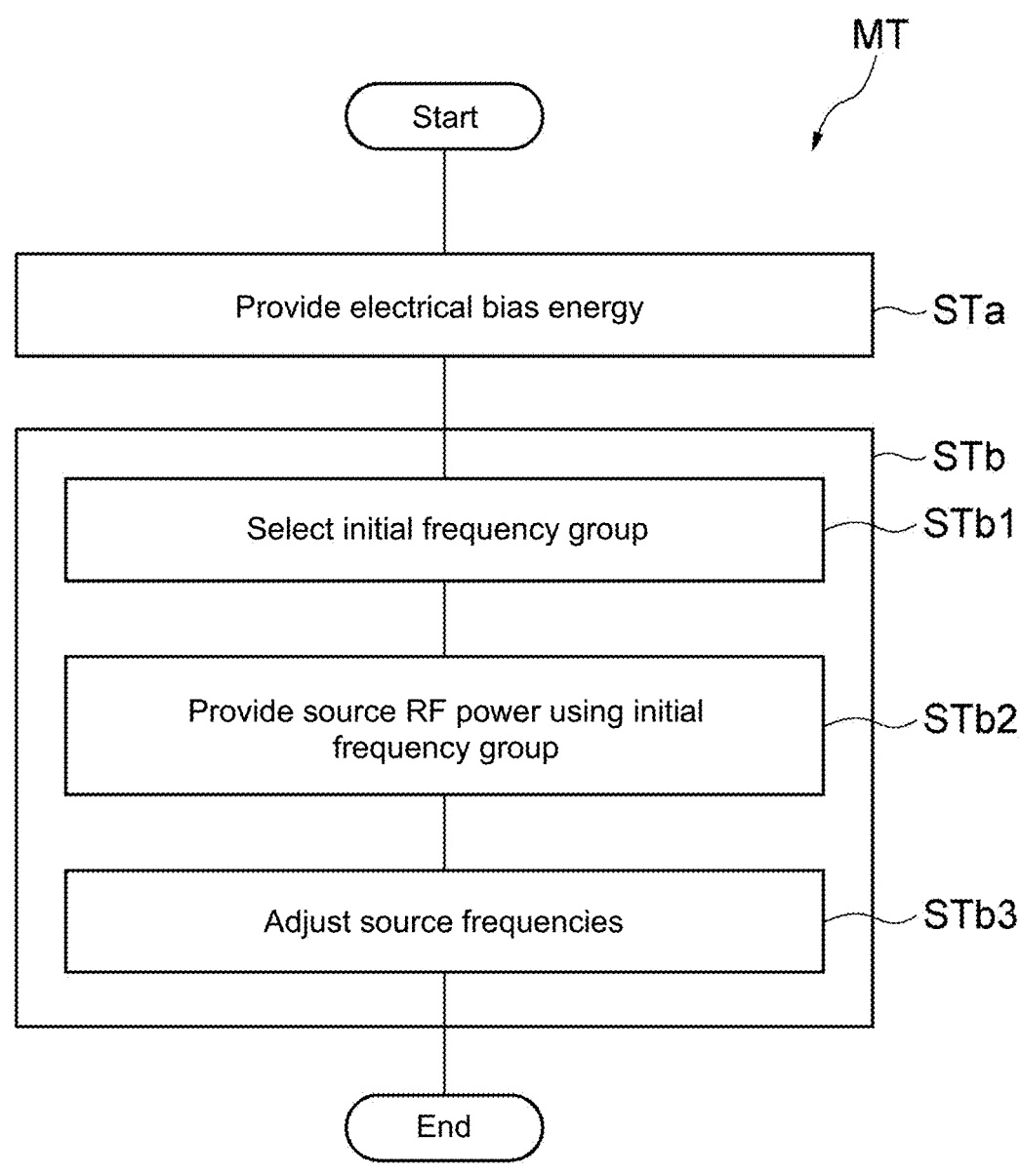
FIG. 10 is a flowchart of a control method according to one exemplary embodiment.

A control method according to one exemplary embodiment will now be described with reference to FIG. 10. FIG. 10 is a flowchart of the control method according to one exemplary embodiment. With the control method shown in FIG. 10 (hereafter referred to as a method MT), the components of the plasma processing apparatus 1 are controlled by the main controller 2 to perform the process specified by the main controller 2 under the process conditions for the process.

The method MT includes steps STa and STb. In step STa, the electrical bias energy BE is provided to the substrate support 11. The electrical bias energy BE is cyclically provided in cycles CY. In step STb, source radio-frequency power is provided from the RF power supply 31 to the RF electrode to generate plasma from a gas in the chamber 10.

Step STb includes steps STb1, STb2, and STb3. In step STb1, the initial frequency group corresponding to the specified process is selected from the multiple frequency groups corresponding to the respective multiple processes. As described above, the multiple frequency groups are stored in the database 50. Step STb2 is performed in the first period $P_1$. In step STb2, the multiple frequencies included in the initial frequency group are used as the multiple source frequencies $f_{RF}$ for the respective multiple phase periods SP in each cycle CY.

Step STb3 is performed in the second period $P_2$. In step STb3, the multiple source frequencies $f_{RF}$ for the respective multiple phase periods SP in each cycle CY are adjusted to reduce the power level of the reflected wave of the source radio-frequency power RF from the load. The multiple source frequencies $f_{RF}$ for the respective multiple phase periods SP in each cycle CY in the second period $P_2$ are adjusted in the manner described above in the first example or the second example.

Figure 11:
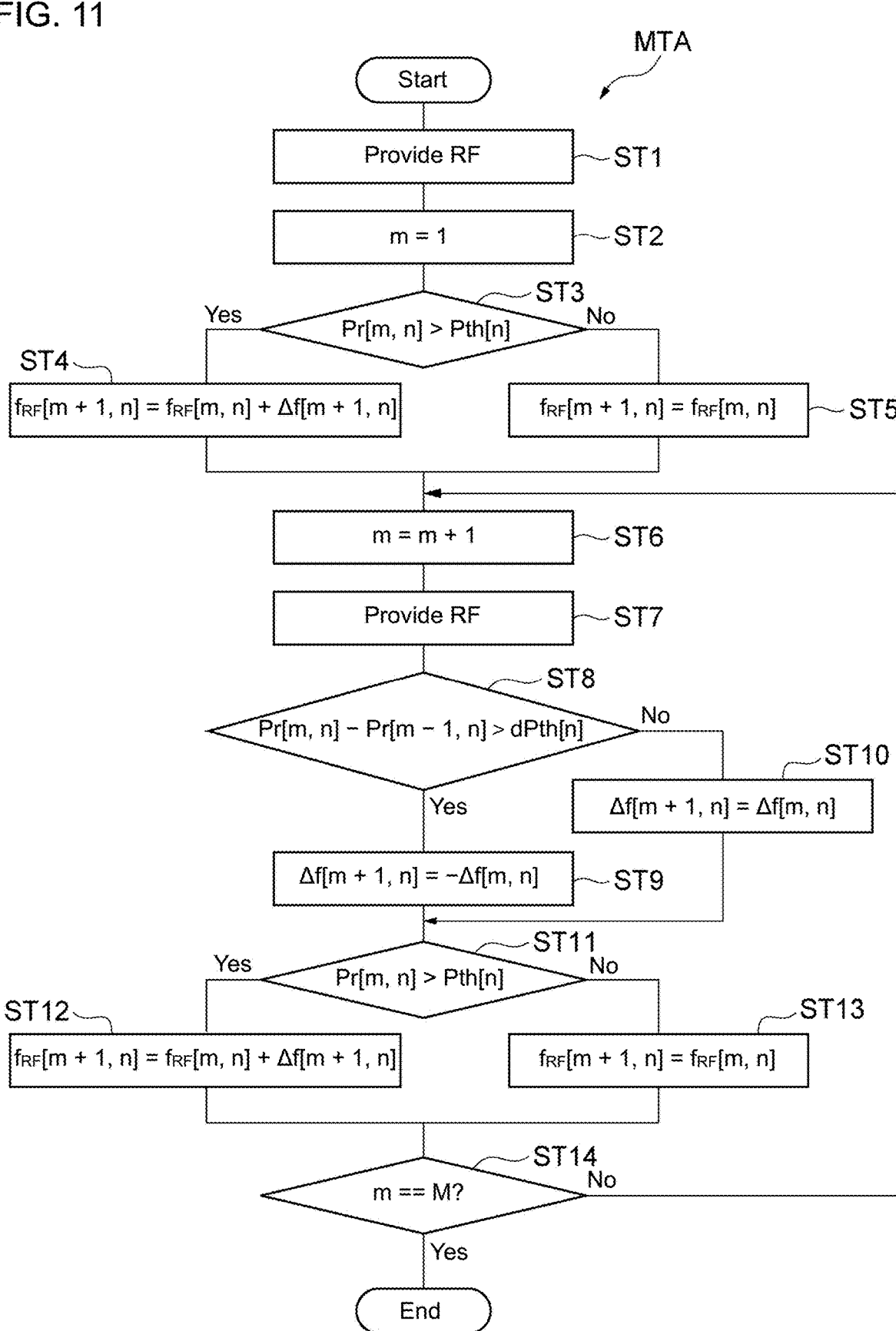
FIG. 11 is a flowchart of a method for adjusting multiple source frequencies for the respective multiple phase periods in each waveform cycle in a second period in a first example.
Figure 12:
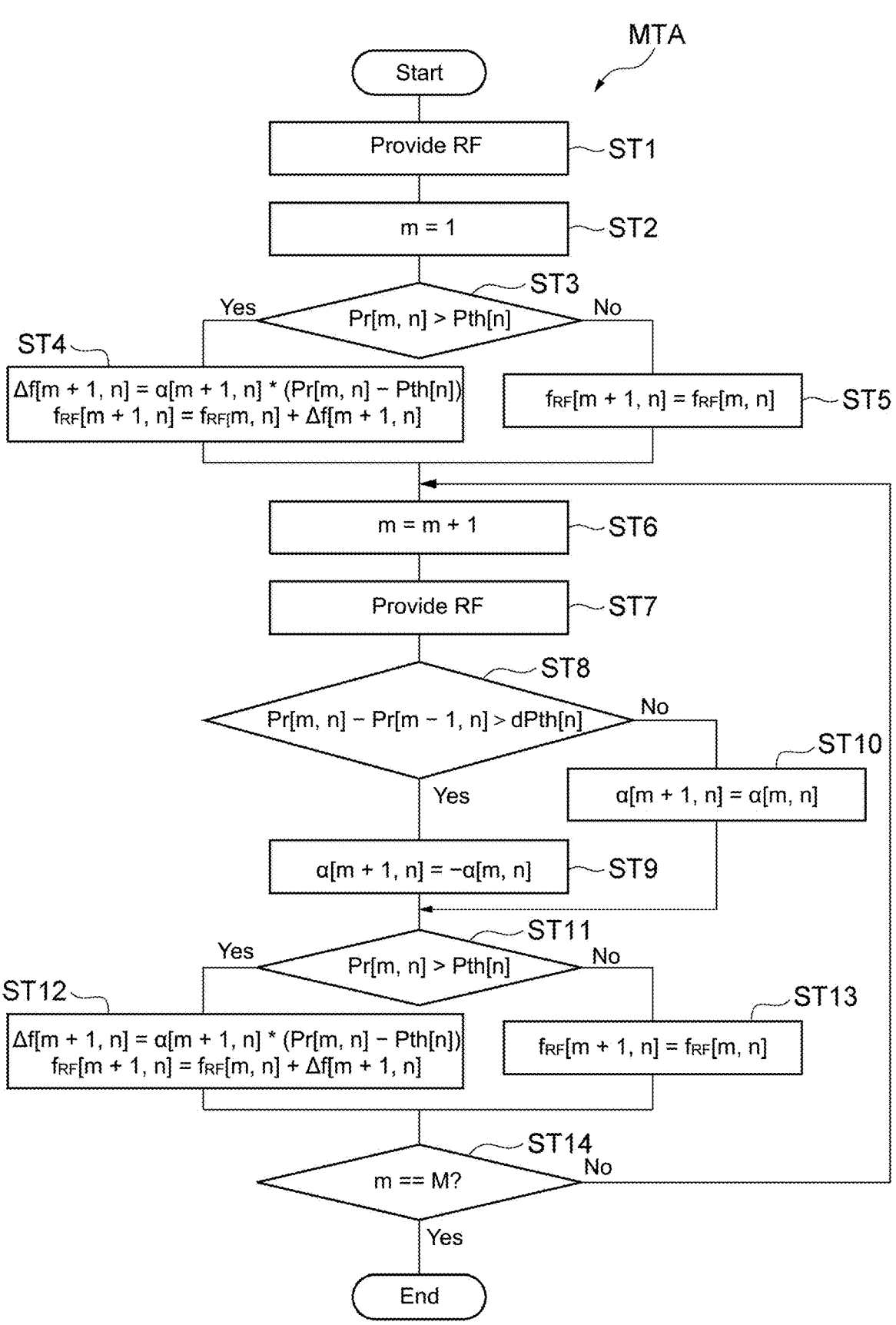
FIG. 12 is a flowchart of a method for adjusting the multiple source frequencies for the respective multiple phase periods in each waveform cycle in the second period in the first example.

A method for adjusting the multiple source frequencies $f_{RF}$ for the respective multiple phase periods SP in each cycle CY in the second period $P_2$ in the first example will now be described in detail with reference to FIGS. 11 and 12. FIGS. 11 and 12 are each a flowchart for adjusting the multiple source frequencies for the respective multiple phase periods in each waveform cycle in the second period in the first example.

With the method for adjustment (hereafter referred to as a method MTA) shown in FIGS. 11 and 12, step ST1 is performed in the first period $P_1$. In step ST1, the source radio-frequency power RF is provided. As described above, in the first period $P_1$, the multiple frequencies included in the initial frequency group are used as the multiple source frequencies $f_{RF}$ for the respective multiple phase periods SP in each cycle CY.

In subsequent step ST2, m is set to 1. Steps ST3 to ST5 are then performed. Steps ST3 to ST5 are performed with n being sequentially set to 1 to N.

In step ST3, the determination is performed as to whether a power level Pr[m, n] is greater than a threshold Pth[n]. The power level Pr[m, n] is a representative value of the power level of the reflected wave of the source radio-frequency power RF in the n-th phase period $SP_n$ in the m-th cycle $CY_m$. The representative value may be the average value or the maximum value. The threshold Pth[n] is predetermined for the phase period $SP_n$. When the power level Pr[m, n] is greater than the threshold Pth[n], or in other words, when the power level of the reflected wave is high in the phase period $SP_n$ in the cycle $CY_m$, step ST4 is performed. When the power level Pr[m, n] is less than or equal to the threshold Pth[n], or in other words, when the power level of the reflected wave is low in the phase period $SP_n$ in the cycle $CY_m$, step ST5 is performed.

As shown in FIG. 11, in step ST4, a source frequency $f_{RF}$[m+1, n] is set to the sum of a source frequency $f_{RF}$[m, n] and a frequency shift $\Delta f$[m+1, n]. The source frequency $f_{RF}$[m, n] is the source frequency $f_{RF}$ for the phase period $SP_n$ in the cycle $CY_m$. The frequency shift $\Delta f$[m, n] is a value added to the source frequency $f_{RF}$[m−1, n] for determining the source frequency $f_{RF}$[m, n]. The initial value ($\Delta f$[2, n]) of the frequency shift is predetermined.

In some embodiments, in step ST4, the frequency shift $\Delta f$[m+1, n] is set to $\alpha$[m+1, n]*(Pr[m, n]−Pth[n]) as shown in FIG. 12. The value $\alpha$[m+1, n] is a coefficient for the n-th phase period $SP_n$ in the cycle $CY_m$+1. The initial value ($\alpha$[2, n]) of the coefficient is predetermined. In step ST4 shown in FIG. 12, the frequency shift $\Delta f$[m+1, n] is set to a value based on the difference between the power level of the reflected wave and the threshold. In step ST4 shown in FIG. 12, the source frequency $f_{RF}$[m+1, n] is set to the sum of the source frequency $f_{RF}$[m, n] and the frequency shift $\Delta f$[m+1, n].

As shown in FIGS. 11 and 12, in step ST5, the source frequency $f_{RF}$[m+1, n] is set to the same as the source frequency $f_{RF}$[m, n].

In subsequent step ST6, m is incremented by one, starting the second period $P_2$. Steps ST7 to ST13 are then performed. Steps ST7 to ST13 are performed with n being sequentially set to 1 to N. In step ST7, the source radio-frequency power RF is provided in the cycle $CY_m$. In the phase period $SP_n$ in the cycle $CY_m$, the source frequency $f_{RF}$ is set to the source frequency $f_{RF}$[m, n].

In subsequent step ST8, the determination is performed as to whether the power level of the reflected wave in the phase period $SP_n$ in the cycle $CY_m$ has increased by an unacceptable level from the power level of the reflected wave in the identical phase period $SP_n$ in a cycle CY preceding the cycle $CY_m$ (e.g., the cycle $CY_{m−1}$). For example, in step ST8, the determination is performed as to whether the difference between the power level Pr[m, n] and the power level Pr[m−1, n] is greater than a threshold $\Delta$dPth[n]. The threshold $\Delta$dPth[n] is predetermined for the n-th phase period $SP_n$. The threshold $\Delta$dPth[n] may be zero.

When the determination result in step ST8 is affirmative, or in other words, when the power level of the reflected wave has increased by an unacceptable level in the phase period $SP_n$ in the cycle $CY_m$, step ST9 is performed. As shown in FIG. 11, in step ST9, the frequency shift $\Delta f$[m+1, n] is set to a frequency shift −$\Delta f$[m, n]. In other words, in step ST9, the direction of the frequency shift is reversed. More specifically, in step ST9, the frequency shift is changed from one of a positive frequency shift or a negative frequency shift to the other. In some embodiments, in step ST9, the coefficient $\alpha$[m+1, n] is set to a coefficient −$\alpha$[m, n] as shown in FIG. 12.

When the determination result in step ST8 is negative, or in other words, when the power level of the reflected wave is acceptable in the phase period $SP_n$ in the cycle $CY_m$, step ST10 is performed. In step ST10, as shown in FIG. 11, the frequency shift $\Delta f$[m+1, n] is set to the same as the frequency shift $\Delta f$[m, n]. In some embodiments, in step ST10, the coefficient $\alpha$[m+1, n] is set to the same as the coefficient $\alpha$[m, n] as shown in FIG. 12.

In subsequent step ST11, the determination is performed as to whether the power level Pr[m, n] is greater than the threshold Pth[n]. When the power level Pr[m, n] is greater than the threshold Pth[n], or in other words, when the power level of the reflected wave is high in the phase period $SP_n$ in the cycle $CY_m$, step ST12 is performed. When the power level Pr[m, n] is less than or equal to the threshold Pth[n], or in other words, when the power level of the reflected wave is low in the phase period $SP_n$ in the cycle $CY_m$, step ST13 is performed.

As shown in FIG. 11, in step ST12, the source frequency $f_{RF}$[m+1, n] is set to the sum of the source frequency $f_{RF}$[m, n] and the frequency shift $\Delta f$[m+1, n]. In some embodiments, in step ST12, the frequency shift $\Delta f$[m+1, n] is set to $\alpha$[m+1, n]*(Pr[m, n]−Pth[n]) as shown in FIG. 12. In other words, in step ST12 shown in FIG. 12, the frequency shift $\Delta f$[m+1, n] is set to a value based on the difference between the power level of the reflected wave and the threshold. In step ST12 shown in FIG. 12, the source frequency $f_{RF}$[m+1, n] is set to the sum of the source frequency $f_{RF}$[m, n] and the frequency shift $\Delta f$[m+1, n].

As shown in FIGS. 11 and 12, in step ST13, the source frequency $f_{RF}$[m+1, n] is set to the same as the source frequency $f_{RF}$[m, n].

In subsequent step ST14, the determination is performed as to whether m is M. In other words, the determination is performed as to whether the processing for the final cycle CY in the second period $P_2$ has ended. When the processing for the final cycle CY has not ended, the processing in ST6 and subsequent steps is repeated. When the processing for the final cycle CY has ended, the method MTA ends.

As described above, with the method MTA, the frequency shift for the phase period $SP_n$ in the m-th cycle $CY_m$ is adjusted based on a change in the power level of the reflected wave of the source radio-frequency power RF in the identical phase periods $SP_n$ in two cycles CY preceding the cycle $CY_m$.

The direction of the frequency shift $\Delta f$[m, n] can be the same as the direction of the frequency shift $\Delta f$[m−1, n]. In this case, the source frequency $f_{RF}$[m+1, n] may be set to an intermediate frequency (e.g., the average value) between the source frequencies $f_{RF}$[m−1, n] and $f_{RF}$[m, n] when the representative value of the power level of the reflected wave of the source radio-frequency power RF in the phase period $SP_n$ in the cycle $CY_m$ is greater than the threshold. When the representative value of the power level of the reflected wave of the source radio-frequency power RF is greater than the threshold with the source frequency $f_{RF}$[m+1, n] being set to the intermediate frequency, the direction of the frequency shift $\Delta f$[m+2, n] may be reversed from the direction of the frequency shift $\Delta f$[m, n], with the frequency shift $\Delta f$[m+2, n]

having a greater absolute value than the frequency shift $\Delta f[m, n]$. This avoids the situation in which the amount of reflection of the source radio-frequency power RF fails to decrease from a local minimum value.

Figure 13:
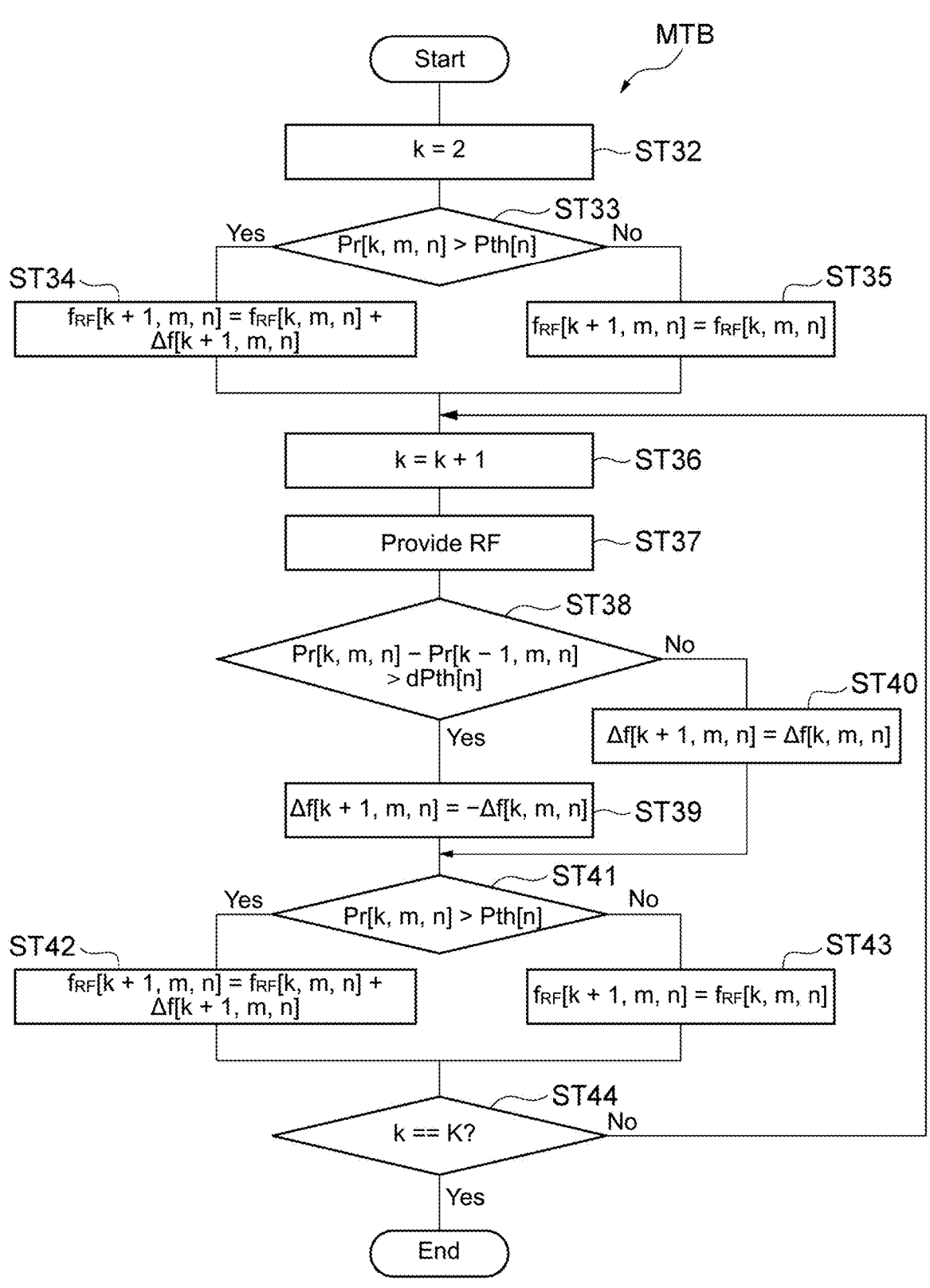
FIG. 13 is a flowchart of an example method for adjusting the source frequencies for the multiple phase periods in each waveform cycle in a transition period.
Figure 14:
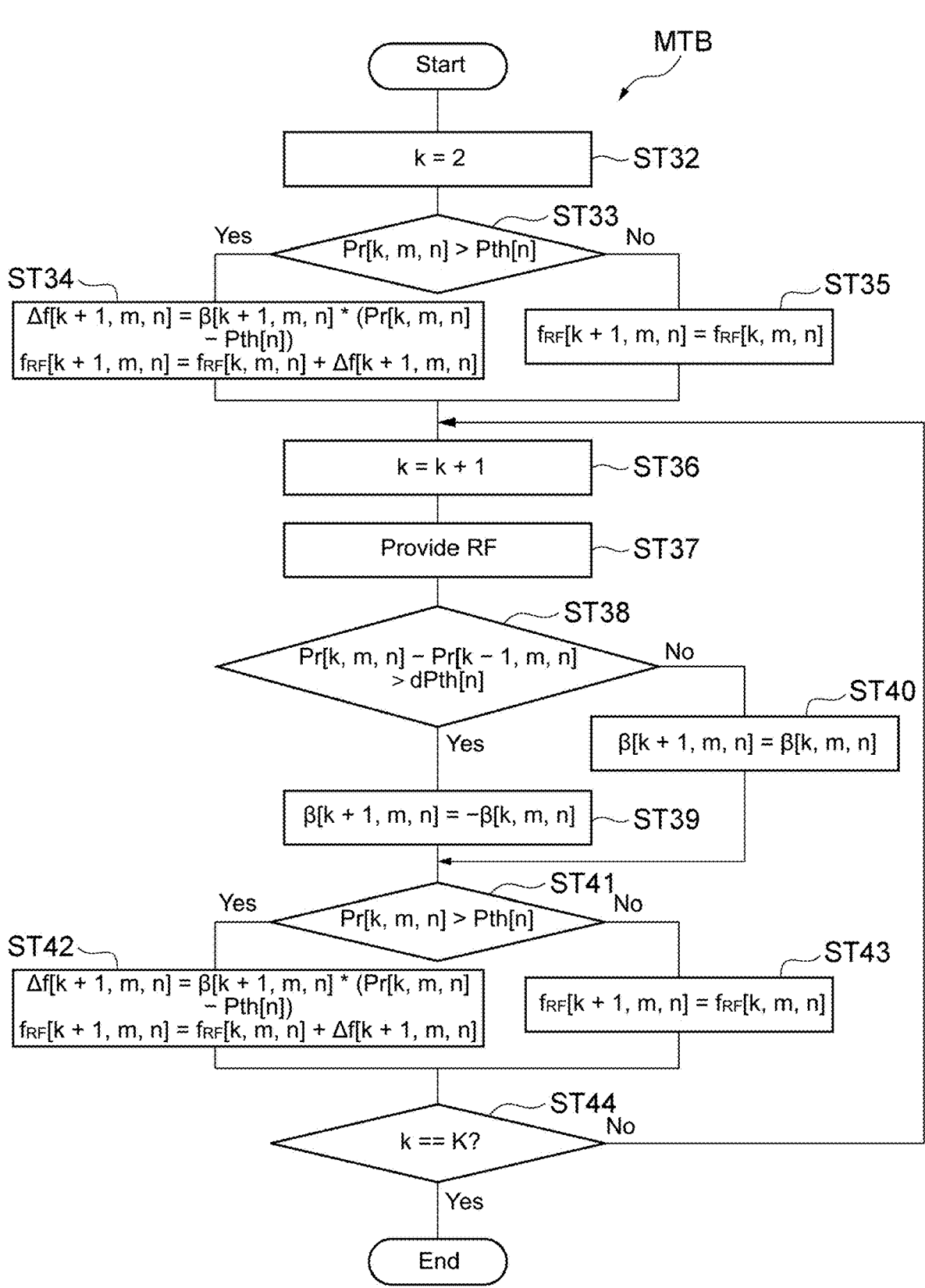
FIG. 14 is a flowchart of an example method for adjusting the source frequencies for the multiple phase periods in each waveform cycle in the transition period.

A method for adjusting the multiple source frequencies $f_{RF}$ for the respective multiple phase periods SP in each cycle CY in the transition period $P_T$ will now be described in detail with reference to FIGS. 13 and 14. FIGS. 13 and 14 are each a flowchart of an example method for adjusting the source frequencies for the multiple phase periods in each waveform cycle in the transition period.

With the method for adjustment (hereafter referred to as a method MTB) shown in FIGS. 13 and 14, k is set to 2 in step ST32. Steps ST33 to ST35 are then performed. Steps ST33 to ST35 are performed with m being sequentially changed to 1 to $M_T$ and n being sequentially changed to 1 to N, where $M_T$ is the number of cycles CY in the transition period $P_T$.

In step ST33, the determination is performed as to whether a power level $Pr[k, m, n]$ is greater than a threshold $Pth[n]$. The power level $Pr[k, m, n]$ is a representative value of the power level of the reflected wave of the source radio-frequency power RF in the n-th phase period $SP_n$ in the m-th cycle $CY_m$ in the k-th pulse period $PP_k$. The representative value may be the average value or the maximum value. The threshold $Pth[n]$ is predetermined for the n-th phase period $SP_n$. When the power level $Pr[k, m, n]$ is greater than the threshold $Pth[n]$, or in other words, when the power level of the reflected wave is high in the phase period $SP_n$ in the cycle $CY_m$ in the pulse period $PP_k$, step ST34 is performed. When the power level $Pr[k, m, n]$ is less than or equal to the threshold $Pth[n]$, or in other words, when the power level of the reflected wave is low in the phase period $SP_n$ in the cycle $CY_m$ in the pulse period $PP_k$, step ST35 is performed.

As shown in FIG. 13, in step ST34, a source frequency $f_{RF}[k+1, m, n]$ is set to the sum of a source frequency $f_{RF}[k, m, n]$ and a frequency shift $\Delta f[k+1, m, n]$. The source frequency $f_{RF}[k, m, n]$ is the source frequency $f_{RF}$ for the phase period $SP_n$ in the cycle $CY_m$ in the pulse period $PP_k$. The frequency shift $\Delta f[k, m, n]$ is a value added to the source frequency $f_{RF}[k-1, m, n]$ for determining the source frequency $f_{RF}[k, m, n]$. The initial value ($\Delta f[3, m, n]$) of the frequency shift is predetermined.

In some embodiments, in step ST34, the frequency shift $\Delta f[k+1, m, n]$ is set to $\beta[k+1, m, n]*(Pr[k, m, n]-Pth[n])$ as shown in FIG. 14. The value $\beta[k+1, m, n]$ is a coefficient for the phase period $SP_n$ in the cycle $CY_m$ in the pulse period $PP_k$. The initial value ($B[3, m, n]$) of the coefficient is predetermined. In step ST34 shown in FIG. 14, the frequency shift $\Delta f[k+1, m, n]$ is set to a value based on the difference between the power level of the reflected wave and the threshold. In step ST34 shown in FIG. 14, the source frequency $f_{RF}[k+1, m, n]$ is set to the sum of the source frequency $f_{RF}[k, m, n]$ and the frequency shift $\Delta f[k+1, m, n]$.

As shown in FIGS. 13 and 14, in step ST35, the source frequency $f_{RF}[k+1, m, n]$ is set to the same as the source frequency $f_{RF}[k, m, n]$.

In subsequent step ST36, k is incremented by one. Steps ST37 to ST43 are then performed. Steps ST37 to ST43 are performed with m being sequentially changed to 1 to $M_T$ and n being sequentially changed to 1 to N. In step ST37, the source radio-frequency power RF is provided in the pulse period $PP_k$. In the phase period $SP_n$ in the cycle $CY_m$ in the pulse period $PP_k$, the source frequency $f_{RF}$ is set to the source frequency $f_{RF}[k, m, n]$.

In subsequent step ST38, the determination is performed as to whether the power level of the reflected wave in the phase period $SP_n$ in the cycle $CY_m$ in the pulse period $PP_k$ has increased by an unacceptable level from the power level of the reflected wave in the identical phase period $SP_n$ in the identical cycle $CY_m$ in a pulse period preceding the pulse period $PP_k$ (e.g., the pulse period $PP_{k-1}$). For example, in step ST38, the determination is performed as to whether the difference between the power levels $Pr[k, m, n]$ and $Pr[k-1, m, n]$ is greater than a threshold $\Delta dPth[n]$. The threshold $\Delta dPth[n]$ is predetermined for the n-th phase period $SP_n$. The threshold $\Delta dPth[n]$ may be zero.

When the determination result in step ST38 is affirmative, or in other words, when the power level of the reflected wave has increased by an unacceptable level in the phase period $SP_n$ in the cycle $CY_m$ in the pulse period $PP_k$, step ST39 is performed. As shown in FIG. 13, in step ST39, the frequency shift $\Delta f[k+1, m, n]$ is set to a frequency shift $-\Delta f[k, m, n]$. In other words, in step ST39, the direction of the frequency shift is reversed. More specifically, in step ST39, the frequency shift is changed from one of a positive frequency shift or a negative frequency shift to the other. In some embodiments, in step ST39, the coefficient $\beta[k+1, m, n]$ is set to a coefficient $-\beta[k, m, n]$ as shown in FIG. 14.

When the determination result in step ST38 is negative, or in other words, when the power level of the reflected wave is acceptable in the phase period $SP_n$ in the cycle $CY_m$ in the pulse period $PP_k$, step ST40 is performed. In step ST40, as shown in FIG. 13, the frequency shift $\Delta f[k+1, m, n]$ is set to the same as the frequency shift $\Delta f[k, m, n]$. In some embodiments, in step ST40, the coefficient $\beta[k+1, m, n]$ is set to the same as the coefficient $ß[k, m, n]$ as shown in FIG. 14.

In subsequent step ST41, the determination is performed as to whether the power level $Pr[k, m, n]$ is greater than the threshold $Pth[n]$. When the power level $Pr[k, m, n]$ is greater than the threshold $Pth[n]$, or in other words, when the power level of the reflected wave is high in the phase period $SP_n$ in the cycle $CY_m$, step ST42 is performed. When the power level $Pr[k, m, n]$ is less than or equal to the threshold $Pth[n]$, or in other words, when the power level of the reflected wave is low in the phase period $SP_n$ in the cycle $CY_m$, step ST43 is performed.

As shown in FIG. 13, in step ST42, the source frequency $f_{RF}[k+1, m, n]$ is set to the sum of the source frequency $f_{RF}[k, m, n]$ and the frequency shift $\Delta f[k+1, m, n]$. In some embodiments, in step ST42, the frequency shift $\Delta f[k+1, m, n]$ is set to $ß[k+1, m, n]*(Pr[k, m, n]-Pth[n])$ as shown in FIG. 14. In other words, in step ST42 shown in FIG. 14, the frequency shift $\Delta f[k+1, m, n]$ is set to a value based on the difference between the power level of the reflected wave and the threshold. In step ST14 shown in FIG. 14, the source frequency $f_{RF}[k+1, m, n]$ is set to the sum of the source frequency $f_{RF}[k, m, n]$ and the frequency shift $\Delta f[k+1, m, n]$.

As shown in FIGS. 13 and 14, in step ST43, the source frequency $f_{RF}[k+1, m, n]$ is set to the same as the source frequency $f_{RF}[k, m, n]$.

In subsequent step ST44, the determination is performed as to whether k is K. In other words, the determination is performed as to whether the processing for the final pulse period $PP_k$ has ended. When the processing for the final pulse period $PP_k$ has not ended, the processing in ST36 and subsequent steps is repeated. When the processing for the final pulse period $PP_k$ has ended, the method MTB ends.

As described above, with the method MTB, the frequency shift for the phase period $SP_n$ in the m-th cycle $CY_m$ in the pulse period $PP_k$ is adjusted based on a change in the power level of the reflected wave of the source radio-frequency power RF in the identical phase periods $SP_n$ in the identical cycles $CY_m$ in two pulse periods PP preceding the pulse period $PP_k$.

The direction of the frequency shift $\Delta f[k, m, n]$ can be the same as the direction of the frequency shift $\Delta f[k-1, m, n]$. In this case, the source frequency $f_{RF}[k+1, m, n]$ may be set to an intermediate frequency (e.g., the average value) between the source frequencies $f_{RF}[k-1, m, n]$ and $f_{RF}[k, m, n]$ when the representative value of the power level of the reflected wave of the source radio-frequency power RF in the phase period $SP_n$ in the cycle $CY_m$ in the pulse period $PP_k$ is greater than the threshold. When the representative value of the power level of the reflected wave of the source radio-frequency power RF is greater than the threshold with the source frequency $f_{RF}[k+1, m, n]$ being set to the intermediate frequency, the direction of the frequency shift $\Delta f[k+2, m, n]$ may be reversed from the direction of the frequency shift $\Delta f[k, m, n]$, with the frequency shift $\Delta f[k+2, m, n]$ having a greater absolute value than the frequency shift $\Delta f[k, m, n]$. This avoids the situation in which the amount of reflection of the source radio-frequency power RF fails to decrease from a local minimum value.

Although the exemplary embodiments have been described above, the embodiments are not restrictive, and various additions, omissions, substitutions, and changes may be made. The components in the different embodiments may be combined to form another embodiment.

In other embodiments, the plasma processing apparatus may be an ICP plasma processing apparatus, an ECR plasma processing apparatus, an HWP plasma processing apparatus, or an SWP plasma processing apparatus. Any of these plasma processing apparatuses uses the source radio-frequency power RF to generate plasma.

Each of the methods MTA and MTB uses a representative value of the power level of the reflected wave of the source radio-frequency power RF in the phase period $SP_n$ as the representative value in the phase period $SP_n$. The representative value in the phase period $SP_n$ may be any value that represents the degree of reflection of the source radio-frequency power RF in the phase period $SP_n$. In some embodiments, the representative value in the phase period $SP_n$ may be a representative value (e.g., the average value or the maximum value) of the ratio of the power level Pr of the reflected wave to the output power level of the source radio-frequency power RF. In some embodiments, the representative value in the phase period $SP_n$ may be a representative value (e.g., the average value or the maximum value) of the phase difference between the voltage and the current obtained by the sensor 36.

In some embodiments, the database 50 may store the multiple frequency groups for all the respective cycles CY included in the ignition period $P_{IG}$ and the first period $P_1$ in the continuous power supply period Pc in a manner associated with each process (process ID). The RF power supply 31 may use the multiple frequency groups corresponding to a specified process (process ID) for all the respective cycles CY included in the ignition period $P_{IG}$ and the first period $P_1$ in the continuous power supply period Pc. In this case, the transformation matrix A may include elements in L×N rows and Y columns, where L is the number of frequency groups, or the number of all the cycles CY included in the ignition period $P_{IG}$ and the first period $P_1$ in the continuous power supply period Pc. In this case, each of the output matrix O and the matrix F includes elements in L×N rows and X columns.

In some embodiments, the database 50 may store a single combination of frequency groups common in all the multiple pulse periods $PP_1$ to $PP_k$ in a manner associated with each process (process ID). The single combination of frequency groups includes multiple frequency groups. The RF power supply 31 may use the multiple frequency groups included in the single combination of frequency groups for all the respective cycles included in the ignition period $P_{IG}$ and the first period $P_1$ in each of the multiple pulse periods $PP_1$ to $PP_k$. In this case as well, the transformation matrix A may include elements in L×N rows and Y columns, where L is the number of frequency groups included in the single combination of frequency groups, or the number of all the cycles CY included in the ignition period $P_{IG}$ and the first period $P_1$ in each of the multiple pulse periods $PP_1$ to $PP_k$. In this case, each of the output matrix O and the matrix F includes elements in L×N rows and X columns.

In some embodiments, the database 50 may store multiple combinations of frequency groups for the respective multiple pulse periods $PP_1$ to $PP_k$ in a manner associated with each process (process ID). Each of the multiple combinations of frequency groups includes multiple frequency groups. The RF power supply 31 may select a combination of frequency groups for a pulse period from the multiple combinations of frequency groups corresponding to a specified process (process ID). The RF power supply 31 may use the multiple frequency groups included in the selected combination of frequency groups for all the respective cycles included in the ignition period $P_{IG}$ and the first period $P_1$ in the pulse period. In this case, multiple transformation matrices A are created for the respective multiple pulse periods $PP_1$ to $PP_k$. Each of the multiple transformation matrices A may include elements in L×N rows and Y columns, where L is the number of frequency groups for the pulse period, or the number of all the cycles CY included in the ignition period $P_{IG}$ and the first period $P_1$ in the pulse period. In this case, each of the output matrix O and the matrix F includes elements in L×N rows and X columns.

Various exemplary embodiments E1 to E19 included in the disclosure will now be described.

E1

A plasma processing apparatus, comprising:

a chamber;

a substrate support in the chamber;

a bias power supply electrically coupled to the substrate support, the bias power supply being configured to generate electrical bias energy, the electrical bias energy having a bias frequency, the electrical bias energy having waveform cycles each having a duration being an inverse of the bias frequency; and a radio-frequency power supply electrically coupled to a radio-frequency electrode, the radio-frequency power supply being configured to generate source radio-frequency power to generate plasma from a gas in the chamber, wherein the radio-frequency power supply selects an initial frequency group corresponding to a specified process, uses, in a first period, a plurality of frequencies included in the initial frequency group as a plurality of source frequencies of the source radio-frequency power for a respective plurality of phase periods in a waveform cycle of the electrical bias energy, and adjusts, in a second period subsequent to the first period, the plurality of source frequencies of the source radio-frequency power for the respective plurality of phase periods in a waveform cycle of the electrical bias energy to decrease a power level of a reflected wave of the source radio-frequency power from a load.

E2

The plasma processing apparatus according to E1, wherein when a plurality of frequency groups corresponding to a respective plurality of processes include a frequency group corresponding to the specified process, the radio-frequency power supply selects, as the initial frequency group, the frequency group corresponding to the specified process.

E3

The plasma processing apparatus according to E2, wherein the radio-frequency power supply updates the frequency group corresponding to the specified process with a frequency group including a plurality of source frequencies of the source radio-frequency power for the respective plurality of phase periods obtained through repeated waveform cycles of the electrical bias energy in the second period.

E4

The plasma processing apparatus according to E3, wherein the plurality of frequency groups are stored in a database in a manner associated with a plurality of process condition datasets for the respective plurality of processes.

E5

The plasma processing apparatus according to E4, wherein the database is included in a server accessible by the plasma processing apparatus or by the plasma processing apparatus and another plasma processing apparatus through communication.

E6

The plasma processing apparatus according to E4 or E5, wherein each of the plurality of process condition datasets includes a plurality of condition items.

E7

The plasma processing apparatus according to E6, wherein the database stores a transformation matrix, the transformation matrix minimizes an error between an output matrix and a matrix having a plurality of columns representing the plurality of frequency groups, and the output matrix is a product of the transformation matrix and an input matrix having a plurality of columns representing the plurality of process condition datasets.

E8

The plasma processing apparatus according to E7, wherein in response to an update of the frequency group corresponding to the specified process, the transformation matrix is updated to minimize an error between an output matrix and a matrix having a plurality of columns representing the plurality of frequency groups including the updated frequency group, and the output matrix is a product of the updated transformation matrix and the input matrix.

E9

The plasma processing apparatus according to E7 or E8, wherein when the plurality of frequency groups corresponding to the respective plurality of processes include no frequency group corresponding to the specified process, the radio-frequency power supply selects, as the initial frequency group, a frequency group being a product of the transformation matrix and a process condition dataset for the specified process.

E10

The plasma processing apparatus according to any one of E6 to E9, wherein each of the plurality of process condition datasets includes, as the plurality of condition items, a pressure in the chamber, a power level of the source radio-frequency power, at least one parameter of the electrical bias energy, and a flow rate of each of one or more gases to be supplied into the chamber.

E11

The plasma processing apparatus according to E10, wherein the electrical bias energy includes bias radio-frequency power having the bias frequency or a pulse of a voltage cyclically generated at a time interval with a duration being the inverse of the bias frequency, and the at least one parameter of the electrical bias energy includes type information indicating whether the electrical bias energy is the bias radio-frequency power or the pulse of the voltage, the bias frequency, a power level of the bias radio-frequency power, a duty cycle of the pulse of the voltage, or a voltage level of the pulse of the voltage.

E12

The plasma processing apparatus according to E11, further comprising:

a matcher including a matching circuit between the radio-frequency power supply and the radio-frequency electrode, wherein each of the plurality of process condition datasets further includes, as the plurality of condition items, a capacitance of at least one variable capacitor in the matching circuit.

E13

The plasma processing apparatus according to E11 or E12, wherein the plasma processing apparatus is a capacitively coupled plasma processing apparatus, the plasma processing apparatus further comprises an upper electrode above the substrate support; and a direct current power supply coupled to the upper electrode, and each of the plurality of process condition datasets further includes, as the plurality of condition items, a voltage level of a direct current voltage to be applied from the direct current power supply to the upper electrode.

E14

The plasma processing apparatus according to any one of E1 to E13, wherein the radio-frequency power supply uses, as a source frequency of the source radio-frequency power in an n-th phase period of the plurality of phase periods in an m-th waveform cycle of the electrical bias energy in the second period, a frequency resulting from a frequency shift from a source frequency of the source radio-frequency power in the n-th phase period in a waveform cycle of the electrical bias energy preceding the m-th waveform cycle to decrease the power level of the reflected wave, where n is 1 to N, and N is a number of the plurality of phase periods in a waveform cycle of the electrical bias energy.

E15

The plasma processing apparatus according to any one of E1 to E13, wherein the radio-frequency power supply sequentially switches a source frequency of the source radio-frequency power among a plurality of candidate frequencies in an n-th phase period of the plurality of phase periods in a waveform cycle of the electrical bias energy in the second period, and selects, from the plurality of candidate frequencies, a frequency minimizing the power level of the reflected wave of the source radio-frequency power from the load as the source frequency of the source radio-frequency power in the n-th phase, where n is 1 to N, and N is a number of the plurality of phase periods in a waveform cycle of the electrical bias energy.

E16

A power supply system, comprising:

a bias power supply configured to generate electrical bias energy to be provided to a substrate support in a chamber in a plasma processing apparatus, the electrical bias energy having a bias frequency, the electrical bias energy having waveform cycles each having a duration being an inverse of the bias frequency; and a radio-frequency power supply configured to generate source radio-frequency power to be provided to a radio-frequency electrode to generate plasma from a gas in the chamber, wherein the radio-frequency power supply selects an initial frequency group corresponding to a specified process, uses, in a first period, a plurality of frequencies included in the initial frequency group as a plurality of source frequencies of the source radio-frequency power for a respective plurality of phase periods in a waveform cycle of the electrical bias energy, and adjusts, in a second period subsequent to the first period, the plurality of source frequencies of the source radio-frequency power for the respective plurality of phase periods in a waveform cycle of the electrical bias energy to decrease a power level of a reflected wave of the source radio-frequency power from a load.

E17

A control method, comprising:

(a) providing electrical bias energy having a bias frequency from a bias power supply to a substrate support in a chamber in a plasma processing apparatus, the electrical bias energy having a bias frequency, the electrical bias energy having waveform cycles each having a duration being an inverse of the bias frequency; and (b) providing source radio-frequency power from a radio-frequency power supply to a radio-frequency electrode to generate plasma from a gas in the chamber, (b) including selecting an initial frequency group corresponding to a specified process, using, in a first period, a plurality of frequencies included in the initial frequency group as a plurality of source frequencies of the source radio-frequency power for a respective plurality of phase periods in a waveform cycle of the electrical bias energy, and adjusting, in a second period subsequent to the first period, the plurality of source frequencies of the source radio-frequency power for the respective plurality of phase periods in a waveform cycle of the electrical bias energy to decrease a power level of a reflected wave of the source radio-frequency power from a load.

E18

A program executable by a computer in a plasma processing apparatus to implement the control method according to E17 with the plasma processing apparatus.

E19

A storage medium storing the program according to E18.

The exemplary embodiments according to the disclosure have been described by way of example, and various changes may be made without departing from the scope and spirit of the disclosure. The exemplary embodiments described above are thus not restrictive, and the true scope and spirit of the disclosure are defined by the appended claims.

REFERENCE SIGNS LIST

1 Plasma processing apparatus
10 Chamber
11 Substrate support
30 Power supply system
31 RF power supply
32 Bias power supply
35 Sensor
36 Sensor

The invention claimed is:

1. A plasma processing apparatus, comprising:

a chamber;

a substrate support in the chamber;

a bias power supply electrically coupled to the substrate support, the bias power supply being configured to generate electrical bias energy, the electrical bias energy having a bias frequency and waveform cycles, each waveform cycle having a duration being an inverse of the bias frequency; and a radio-frequency power supply electrically coupled to a radio-frequency electrode, the radio-frequency power supply being configured to:

generate source radio-frequency power to generate plasma from a gas in the chamber, select an initial frequency group corresponding to a specified process, use, in a first period, a plurality of frequencies included in the initial frequency group as a plurality of source frequencies of the source radio-frequency power for a respective plurality of phase periods in one of the waveform cycles of the electrical bias energy, and adjust, in a second period subsequent to the first period, the plurality of source frequencies of the source radio-frequency power for the respective plurality of phase periods in another one of the waveform cycles of the electrical bias energy to decrease a power level of a reflected wave of the source radio-frequency power from a load.

2. The plasma processing apparatus according to claim 1, wherein when a plurality of frequency groups corresponding to a respective plurality of processes include a frequency group corresponding to the specified process, the radio-frequency power supply is configured to select, as the initial frequency group, the frequency group corresponding to the specified process.

3. The plasma processing apparatus according to claim 2, wherein the radio-frequency power supply is configured to update the frequency group corresponding to the specified process with a frequency group including a plurality of source frequencies of the source radio-frequency power for the respective plurality of phase periods obtained through repeated waveform cycles of the electrical bias energy in the second period.

4. The plasma processing apparatus according to claim 3, wherein the plurality of frequency groups are stored in a database in a manner associated with a plurality of process condition datasets for the respective plurality of processes.

5. The plasma processing apparatus according to claim 4, wherein:
the database is included in a server accessible by the plasma processing apparatus through communication, or
the database is included in a server accessible by the plasma processing apparatus and another plasma processing apparatus through communication.

6. The plasma processing apparatus according to claim 4, wherein each of the plurality of process condition datasets includes a plurality of condition items.

7. The plasma processing apparatus according to claim 6, wherein:
the database is configured to store a transformation matrix,
the transformation matrix minimizes an error between an output matrix and a matrix having a plurality of columns representing the plurality of frequency groups, and
the output matrix is a product of the transformation matrix and an input matrix having a plurality of columns representing the plurality of process condition datasets.

8. The plasma processing apparatus according to claim 7, wherein:
the plasma processing apparatus further includes circuitry configured to update the database,
in response to an update of the frequency group corresponding to the specified process, the circuitry is configured to update the transformation matrix to minimize an error between the output matrix and the matrix having a plurality of columns representing the plurality of frequency groups including the updated frequency group, and
the output matrix is a product of the updated transformation matrix and the input matrix.

9. The plasma processing apparatus according to claim 7, wherein when the plurality of frequency groups corresponding to the respective plurality of processes do not include a frequency group corresponding to the specified process, the radio-frequency power supply is configured to select, as the initial frequency group, a frequency group being a product of the transformation matrix and a process condition dataset for the specified process.

10. The plasma processing apparatus according to claim 6, wherein each of the plurality of process condition datasets includes, as the plurality of condition items, a pressure in the chamber, a power level of the source radio-frequency power, at least one parameter of the electrical bias energy, and a flow rate of each of one or more gases to be supplied into the chamber.

11. The plasma processing apparatus according to claim 10, wherein:
the electrical bias energy includes bias radio-frequency power having the bias frequency or a pulse of a voltage cyclically generated at a time interval with a duration being the inverse of the bias frequency, and
the at least one parameter of the electrical bias energy includes type information indicating whether the electrical bias energy is the bias radio-frequency power or the pulse of the voltage, the bias frequency, a power level of the bias radio-frequency power, a duty cycle of the pulse of the voltage, or a voltage level of the pulse of the voltage.

12. The plasma processing apparatus according to claim 11, further comprising:
a matcher including a matching circuit between the radio-frequency power supply and the radio-frequency electrode,
wherein each of the plurality of process condition datasets further includes, as the plurality of condition items, a capacitance of at least one variable capacitor in the matching circuit.

13. The plasma processing apparatus according to claim 11, wherein:
the plasma processing apparatus is a capacitively coupled plasma processing apparatus,
the plasma processing apparatus further comprises:
an upper electrode above the substrate support; and
a direct current power supply coupled to the upper electrode, and
each of the plurality of process condition datasets further includes, as the plurality of condition items, a voltage level of a direct current voltage to be applied from the direct current power supply to the upper electrode.

14. The plasma processing apparatus according to claim 1, wherein the radio-frequency power supply is configured to use, as a source frequency of the source radio-frequency power in an n-th phase period of the plurality of phase periods in an m-th waveform cycle of the electrical bias energy in the second period, a frequency resulting from a frequency shift from a source frequency of the source radio-frequency power in the n-th phase period in a waveform cycle of the electrical bias energy preceding the m-th waveform cycle to decrease the power level of the reflected wave, where n is 1 to N, and N is a number of the plurality of phase periods in a waveform cycle of the electrical bias energy.

15. The plasma processing apparatus according to claim 1, wherein
the radio-frequency power supply is configured to:
sequentially switch a source frequency of the source radio-frequency power among a plurality of candidate frequencies in an n-th phase period of the plurality of phase periods in the another one of the waveform cycles of the electrical bias energy in the second period, and
select, from the plurality of candidate frequencies, a frequency minimizing the power level of the reflected wave of the source radio-frequency power from the load as the source frequency of the source radio-frequency power in the n-th phase period, where n is 1 to N, and N is a number of the plurality of phase periods in each waveform cycle of the electrical bias energy.

16. A power supply system, comprising:
a bias power supply configured to generate electrical bias energy to be provided to a substrate support in a chamber in a plasma processing apparatus, the electrical bias energy having a bias frequency and waveform cycles, each waveform cycle having a duration being an inverse of the bias frequency; and
a radio-frequency power supply configured to:
generate source radio-frequency power to be provided to a radio-frequency electrode to generate plasma from a gas in the chamber, select an initial frequency group corresponding to a specified process, use, in a first period, a plurality of frequencies included in the initial frequency group as a plurality of source frequencies of the source radio-frequency power for a respective plurality of phase periods in one of the waveform cycles of the electrical bias energy, and adjust, in a second period subsequent to the first period, the plurality of source frequencies of the source radio-frequency power for the respective plurality of phase periods in another one of the waveform cycles of the electrical bias energy to decrease a power level of a reflected wave of the source radio-frequency power from a load.

17. The power supply system according to claim 16, wherein when a plurality of frequency groups corresponding to a respective plurality of processes include a frequency group corresponding to the specified process, the radio-frequency power supply is configured to select, as the initial frequency group, the frequency group corresponding to the specified process.

18. The power supply system according to claim 17, wherein the radio-frequency power supply is configured to update the frequency group corresponding to the specified process with a frequency group including a plurality of source frequencies of the source radio-frequency power for the respective plurality of phase periods obtained through repeated waveform cycles of the electrical bias energy in the second period.

19. A control method, comprising:

(a) providing electrical bias energy having a bias frequency from a bias power supply to a substrate support in a chamber in a plasma processing apparatus, the electrical bias energy having waveform cycles, each waveform cycle having a duration being an inverse of the bias frequency; and (b) providing source radio-frequency power from a radio-frequency power supply to a radio-frequency electrode to generate plasma from a gas in the chamber, (b) including:

selecting an initial frequency group corresponding to a specified process, using, in a first period, a plurality of frequencies included in the initial frequency group as a plurality of source frequencies of the source radio-frequency power for a respective plurality of phase periods in one of the waveform cycles of the electrical bias energy, and adjusting, in a second period subsequent to the first period, the plurality of source frequencies of the source radio-frequency power for the respective plurality of phase periods in another one of the waveform cycles of the electrical bias energy to decrease a power level of a reflected wave of the source radio-frequency power from a load.

20. A non-transitory computer readable storage medium storing computer executable program code that, when run on circuitry of a power supply system, causes the circuitry to perform the control method according to claim 19.

* * * * *